(12) United States Patent
Yang et al.

(10) Patent No.: US 11,532,370 B1
(45) Date of Patent: Dec. 20, 2022

(54) NON-VOLATILE MEMORY WITH FAST MULTI-LEVEL PROGRAM VERIFY

(71) Applicant: SanDisk Technologies LLC, Addison, TX (US)

(72) Inventors: Xiang Yang, Santa Clara, CA (US); Huai-Yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 28 days.

(21) Appl. No.: 17/329,304

(22) Filed: May 25, 2021

(51) Int. Cl.
| | | |
|---|---|---|
| G11C 11/34 | (2006.01) | |
| G11C 16/34 | (2006.01) | |
| G11C 16/10 | (2006.01) | |
| G11C 16/26 | (2006.01) | |
| G11C 11/56 | (2006.01) | |
| H01L 27/11565 | (2017.01) | |
| G11C 16/04 | (2006.01) | |
| H01L 25/065 | (2006.01) | |
| H01L 27/11582 | (2017.01) | |

(52) U.S. Cl.
CPC ...... *G11C 16/3459* (2013.01); *G11C 11/5671* (2013.01); *G11C 16/10* (2013.01); *G11C 16/26* (2013.01); *G11C 16/0483* (2013.01); *H01L 25/0657* (2013.01); *H01L 27/11565* (2013.01); *H01L 27/11582* (2013.01)

(58) Field of Classification Search
CPC ......... G11C 16/10; G11C 16/30; G11C 16/12; G11C 16/0483

USPC .............................. 365/185.18, 185.22, 203
See application file for complete search history.

(56) References Cited

U.S. PATENT DOCUMENTS

| | | |
|---|---|---|
| 6,888,758 B1 | 5/2005 | Hemink |
| 7,020,026 B2 | 3/2006 | Guterman |
| 7,035,146 B2 | 4/2006 | Hemink et al. |
| 7,092,290 B2 | 8/2006 | Hemink |
| 7,139,198 B2 | 11/2006 | Guterman |
| 7,158,421 B2 | 1/2007 | Li et al. |
| 7,206,235 B1 | 4/2007 | Lutze et al. |
| 7,301,817 B2 | 11/2007 | Lee |

(Continued)

FOREIGN PATENT DOCUMENTS

DE    10 2018 106 111    12/2018

*Primary Examiner* — Son T Dinh
(74) *Attorney, Agent, or Firm* — Vierra Magen Marcus LLP

(57) ABSTRACT

To improve programming performance for a non-volatile memory , the verification of multiple programming levels can be performed based on a single discharge of a sensing capacitor through a selected memory cell by using different voltage levels on a second plate of the sensing capacitor: after discharging a first plate of the sensing capacitor through the selected memory cell, a result amount of charge is trapped on the first plate, which is then used to set first and second control gate voltages on a sensing transistor whose control gate is connected to the first place of the sensing capacitor based on respectively setting the second plate of the sensing capacitor to first and second voltage levels. To further improve programming performance, when the non-volatile memory stores in a multistate format, after the next to highest data state finishes programming, the next programming pulse can use a larger step size.

20 Claims, 30 Drawing Sheets

(56) References Cited

U.S. PATENT DOCUMENTS

| | | |
|---|---|---|
| 7,447,081 B2 | 11/2008 | Chan |
| 7,508,715 B2 | 3/2009 | Lee |
| 7,508,721 B2 | 3/2009 | Li |
| 7,688,638 B2 | 3/2010 | Hemink |
| 8,120,967 B2 | 2/2012 | Kang |
| 8,174,895 B2 | 5/2012 | Chen |
| 8,233,324 B2 | 7/2012 | Sharon |
| 8,432,740 B2 | 4/2013 | Li |
| 8,630,120 B2 | 1/2014 | She et al. |
| 8,675,416 B2 | 3/2014 | Lee |
| 8,705,293 B2 | 4/2014 | She |
| 8,971,141 B2 | 3/2015 | Mui |
| 9,142,298 B2 | 9/2015 | Dong |
| 9,437,302 B2 | 9/2016 | Tseng et al. |
| 9,443,606 B2 | 9/2016 | Dutta |
| 10,014,063 B2 | 7/2018 | Tseng |
| 10,102,909 B2 | 10/2018 | Park et al. |
| 10,381,095 B1 | 8/2019 | Date |
| 2006/0146610 A1 | 7/2006 | Takeuchi |
| 2019/0164581 A1* | 5/2019 | Nguyen ............... G11C 7/08 |
| 2019/0333562 A1* | 10/2019 | Vo ..................... G11C 7/062 |

* cited by examiner

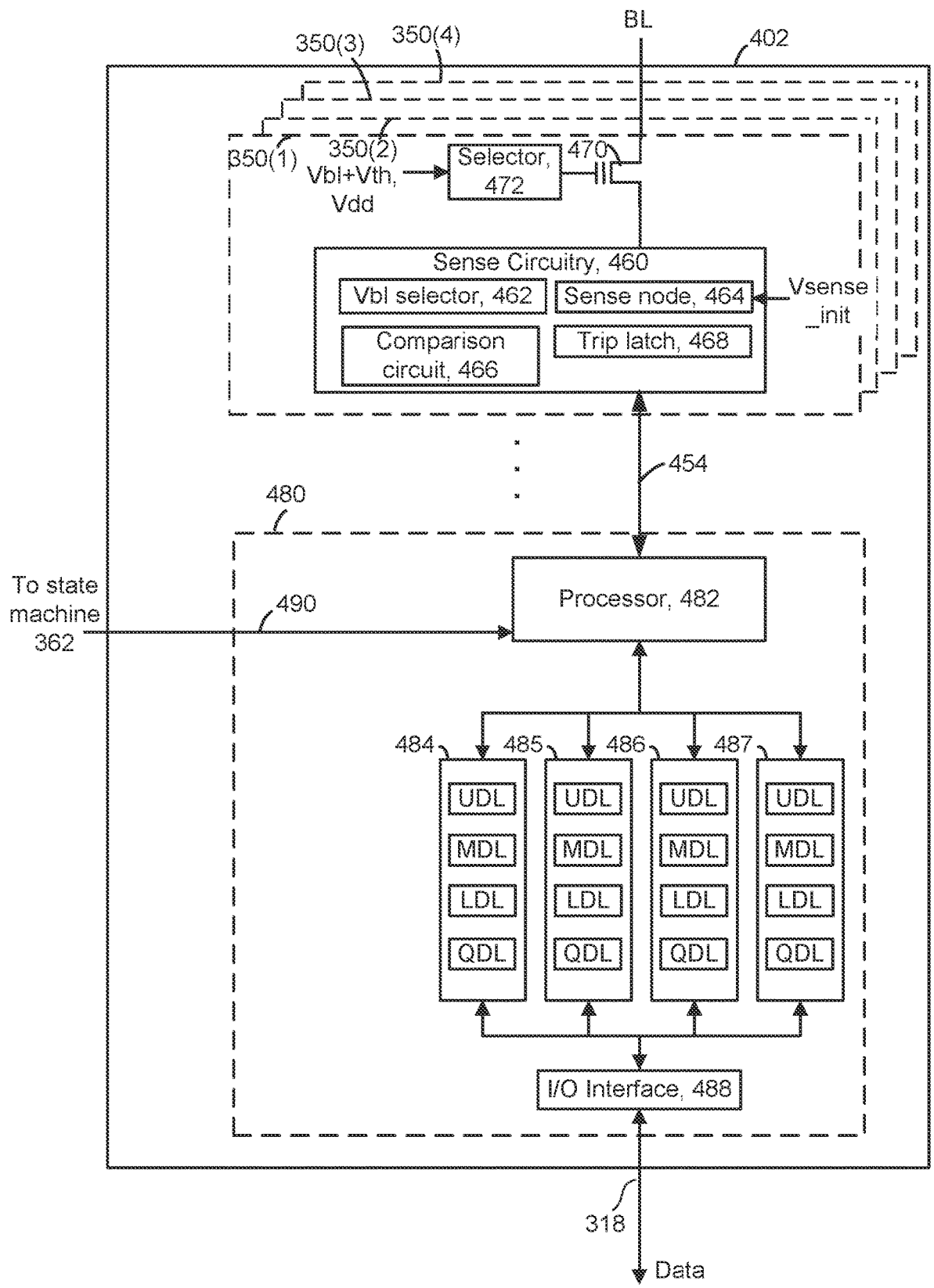

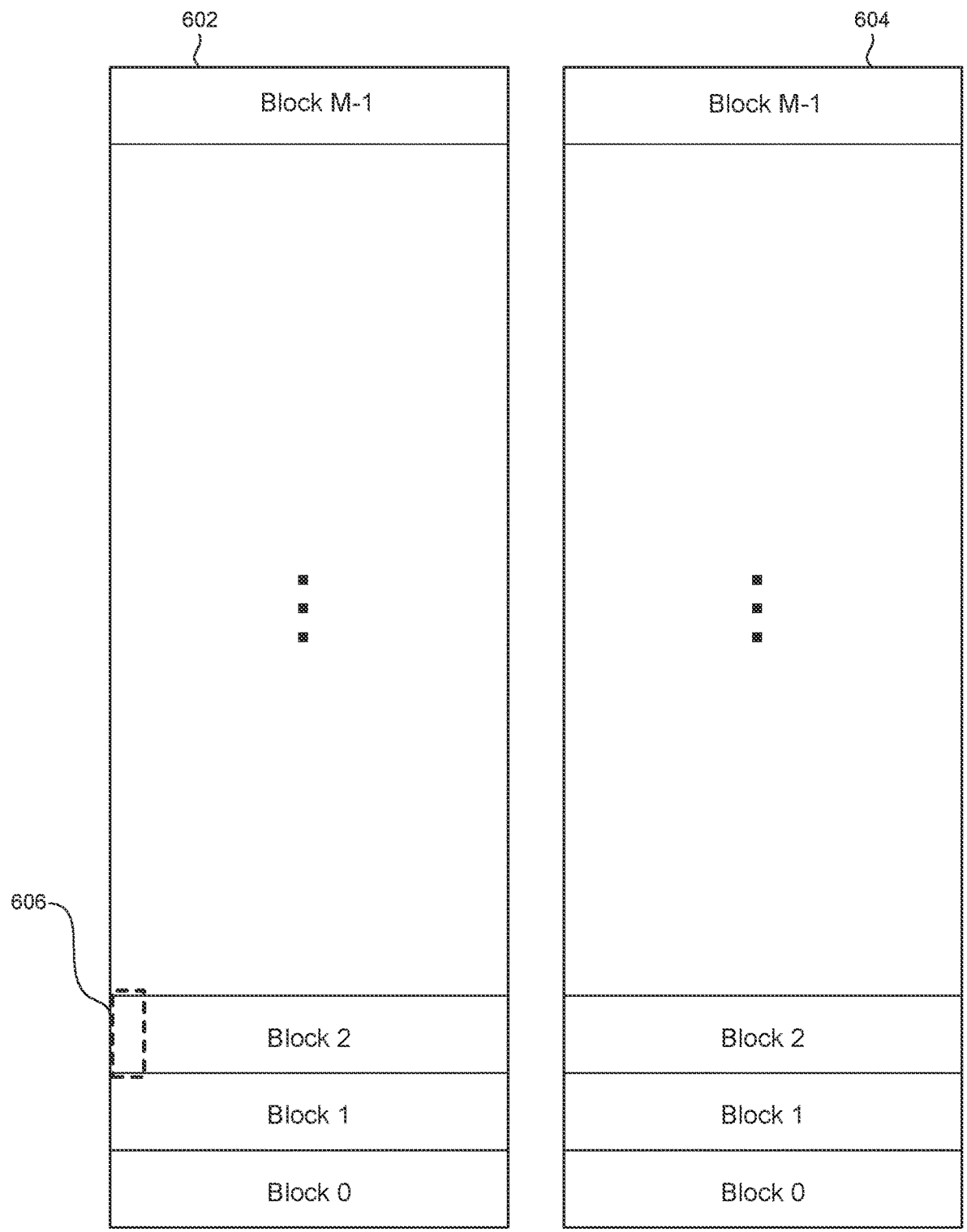

Figure 7A
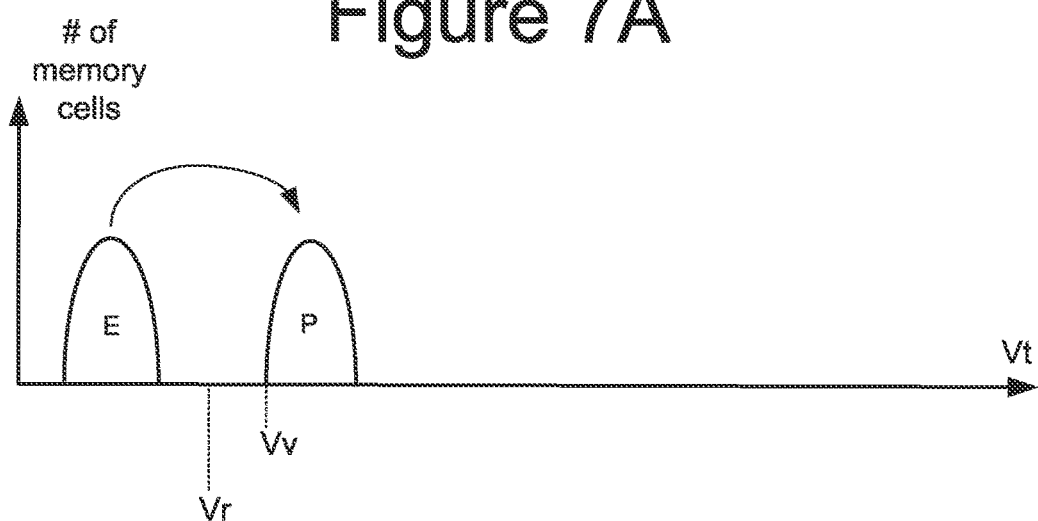
Figure 7B
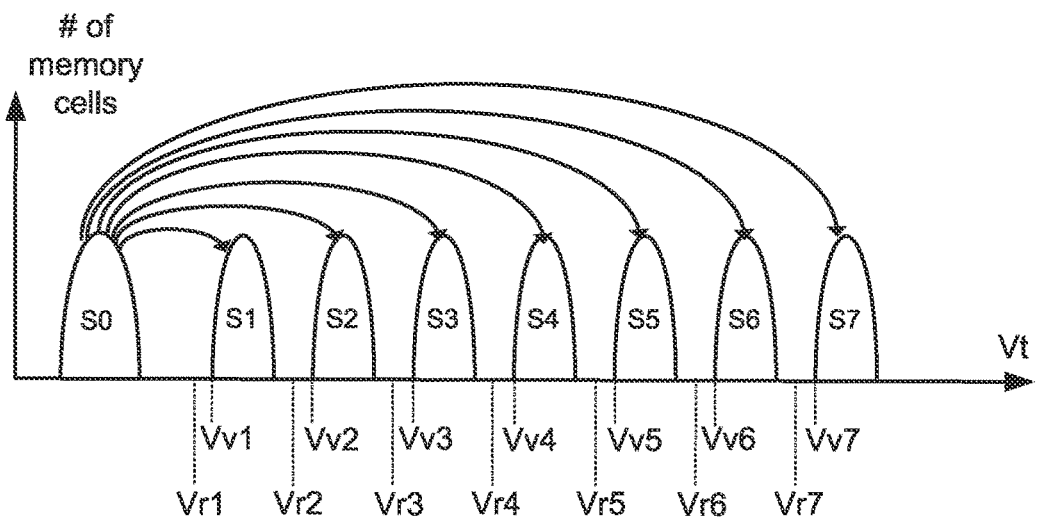
Figure 7C
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

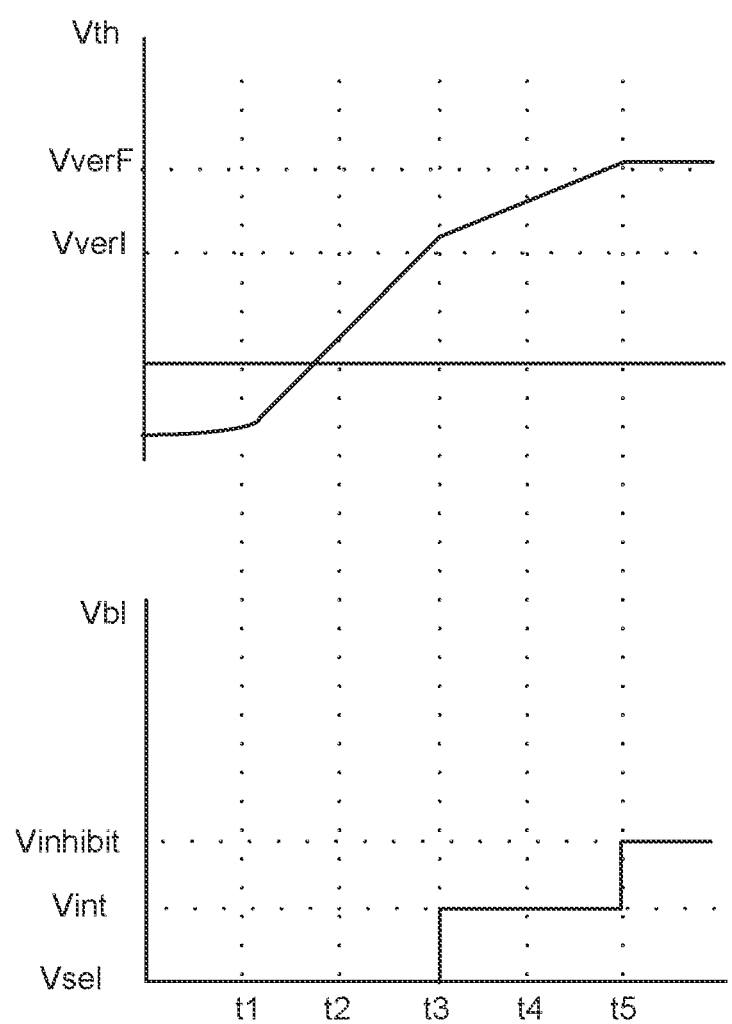

| | Data Latch: UDL/MDL/LDL | Data Latch: QDL | WL Voltage (Common for all cells) | BL Voltage |
|---|---|---|---|---|
| Type 1: "Fast cells" | 101 (S7 state) → 111 (inhibit) | 0 | $V_{pgm}$, then $V_{pgm}+(\alpha\Delta_{pgm}+\Delta V_{pgm})$, then $V_{pgm}+(\alpha\Delta_{pgm}+2*\Delta V_{pgm})$ | Vinhibit (e.g., ~2.5V) |
| Type 2: "Median cells" | 101 (S7 state) | 0 | (e.g., then $V_{pgm}+(0.5V+\Delta V_{pgm})$, then $V_{pgm}+(0.5V+2*\Delta V_{pgm})$) | $\Delta_{pgm}$ (e.g., 0.5V) |
| Type 3: "Slow cells" | 101 (S7 state) | 1 | | 0V |

NON-VOLATILE MEMORY WITH FAST MULTI-LEVEL PROGRAM VERIFY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed.

BRIEF DESCRIPTION OF THE DRAWINGS

Like-numbered elements refer to common components in the different figures.

FIG. 4 is a block diagram depicting one embodiment of a sense block.

FIG. 6B is a block diagram explaining one example organization of memory structure.

FIG. 7A depicts threshold voltage distributions of memory cells in a binary embodiment.

FIG. 7B depicts threshold voltage distributions of memory cells in a multi-level cell (MLC) embodiment.

FIG. 7C is a table describing one example of an assignment of data values to data states.

FIG. 13B is a graph describing the bit line voltage during a programming process.

DETAILED DESCRIPTION

Figure 1A:
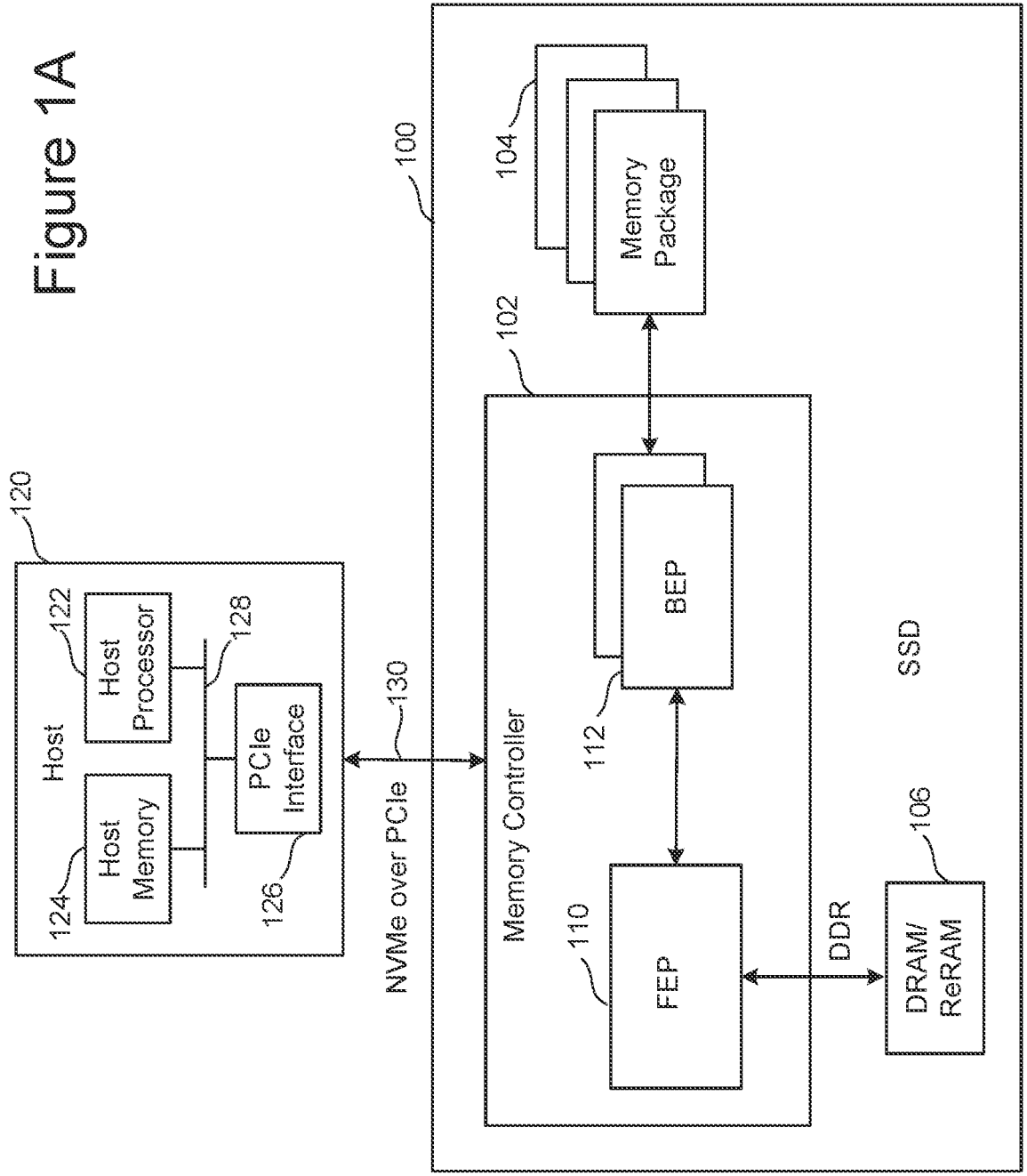
FIG. 1A is a block diagram of one embodiment of a storage system connected to a host.

Non-volatile memory cells are programmed by applying a programming signal as a series of programming voltage pulses (or other doses of programming) to selected memory cells and verifying the memory cells between programming voltage pulses. For memory devices storing data in a multi-level memory cell, or MLC, format, the memory device will typically perform multiple sensing operations as part of the verify process, both to distinguish between the different target data states and also as part of a coarse/fine (or quick pass write) programming process that uses a two-step verification for the same target data state. Consequently, the speed of a program operation is dependent upon how quickly the inter-pulse verify operations can be performed.

One way to perform a sensing operation is to pre-charge a capacitor within a sense amplifier, discharge the capacitor for a sensing interval through a selected memory cell at a rate dependent the conductivity of the memory cell, and then determined whether the memory cell verifies based on the resultant amount of charge on the sense amplifier's capacitor. In a standard verify process, this would involve pre-charging and subsequently discharging the capacitor through the selected memory cell for each verify level, whether for a different target data state or for different verify levels for the same target data state. To improve programming performance, the following presents techniques that allow for a sense amplifier to verify multiple level using only a single pre-charge and discharge through a selected memory cell of the sense amplifier's sensing capacitor. More specifically, after a single pre-charging a first plate of the sensing capacitor and connecting it to a selected memory cell to discharge at a rate dependent the conductivity of the memory cell, the resultant charge on the first plate of the sensing capacitor is used to verify both a first level and a second level by using different voltage levels on sensing capacitor's second plate.

In one set of embodiments, the technique for sensing multiple verify levels based on a single discharge of the sensing capacitor is applied to the highest data state of a multi-level memory device. After the next to highest state completes programming, the programming process can be accelerated by applying a programming pulse that has been increased by a larger step size than in the in previous stairstep programming waveform. Prior to applying the accelerated programming pulse, the memory cells with the highest data state as their target data can be verified at two verify levels using a single discharge of the sensing capacitor through the memory array to separate the memory cells into fast, median, and slow memory cells that can be respectively biased to be inhibited from further programming, to offset the additional voltage of the accelerated programming pulse, or to receive the full strength of the accelerated programming pulse.

FIGS. 1A-6F describe one example of a storage system that can be used to implement the technology disclosed herein.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid state drive ("SSD"); however, other types of storage systems can also be used. Storage system 100 comprises a memory controller 102, memory package 104 for storing data, and local memory (e.g., MRAM/DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two dimensional NAND flash memory and/or three dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
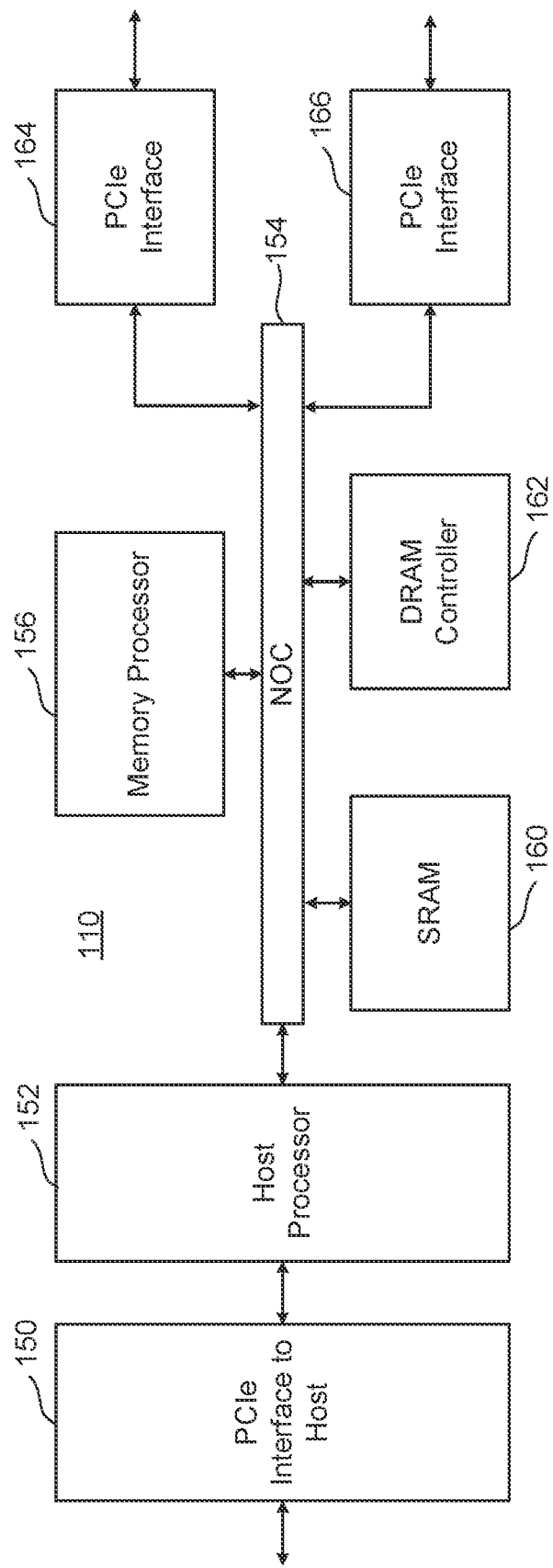
FIG. 1B is a block diagram of one embodiment of a Front End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the local memory 106 (e.g., DRAM/MRAM/ReRAM). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
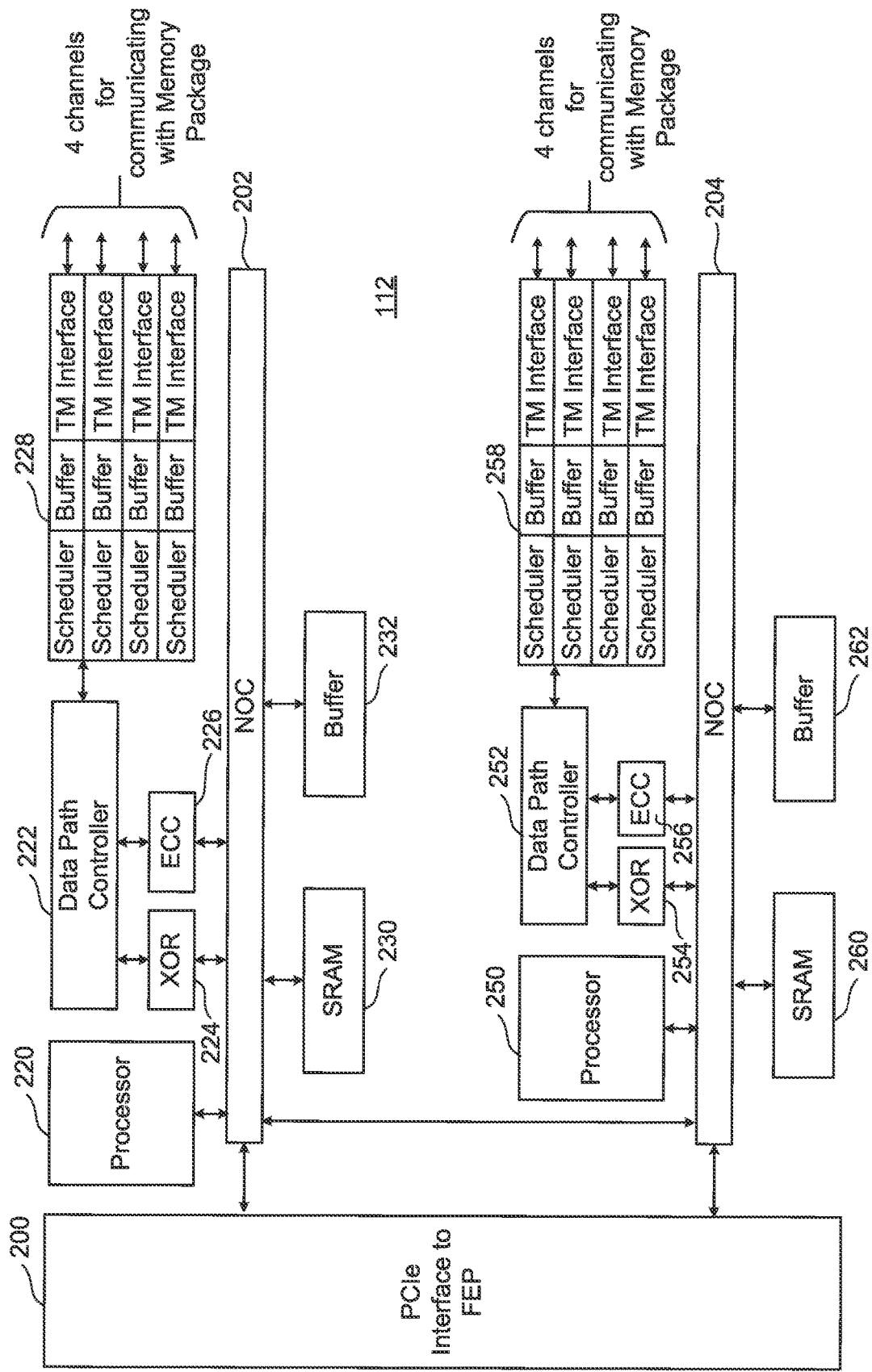
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 are able to recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
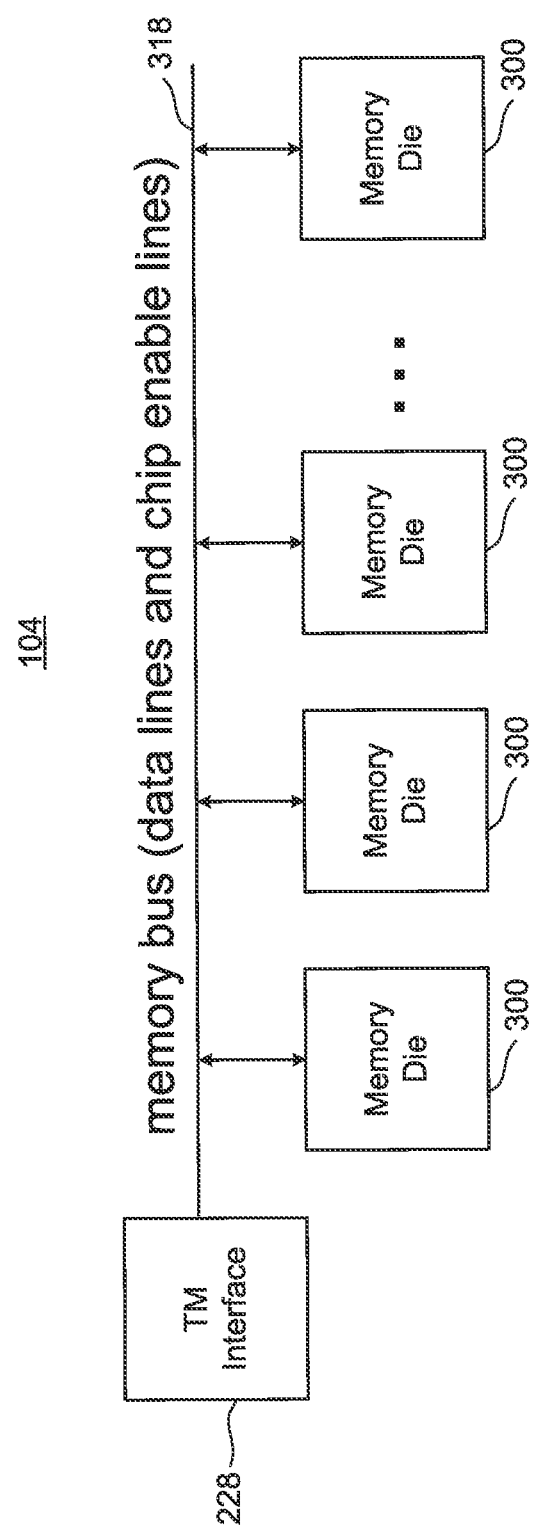
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or sixteen memory die; however, other numbers of memory die can also be implemented. The technology described herein is not limited to any particular number of memory die. In some embodiments, the memory package can also include a processor, CPU device, such as a RISC-V CPU along with some amount of RAM to help implement some of capabilities described below. The technology described herein is not limited to any particular number of memory die.

Figure 3A:
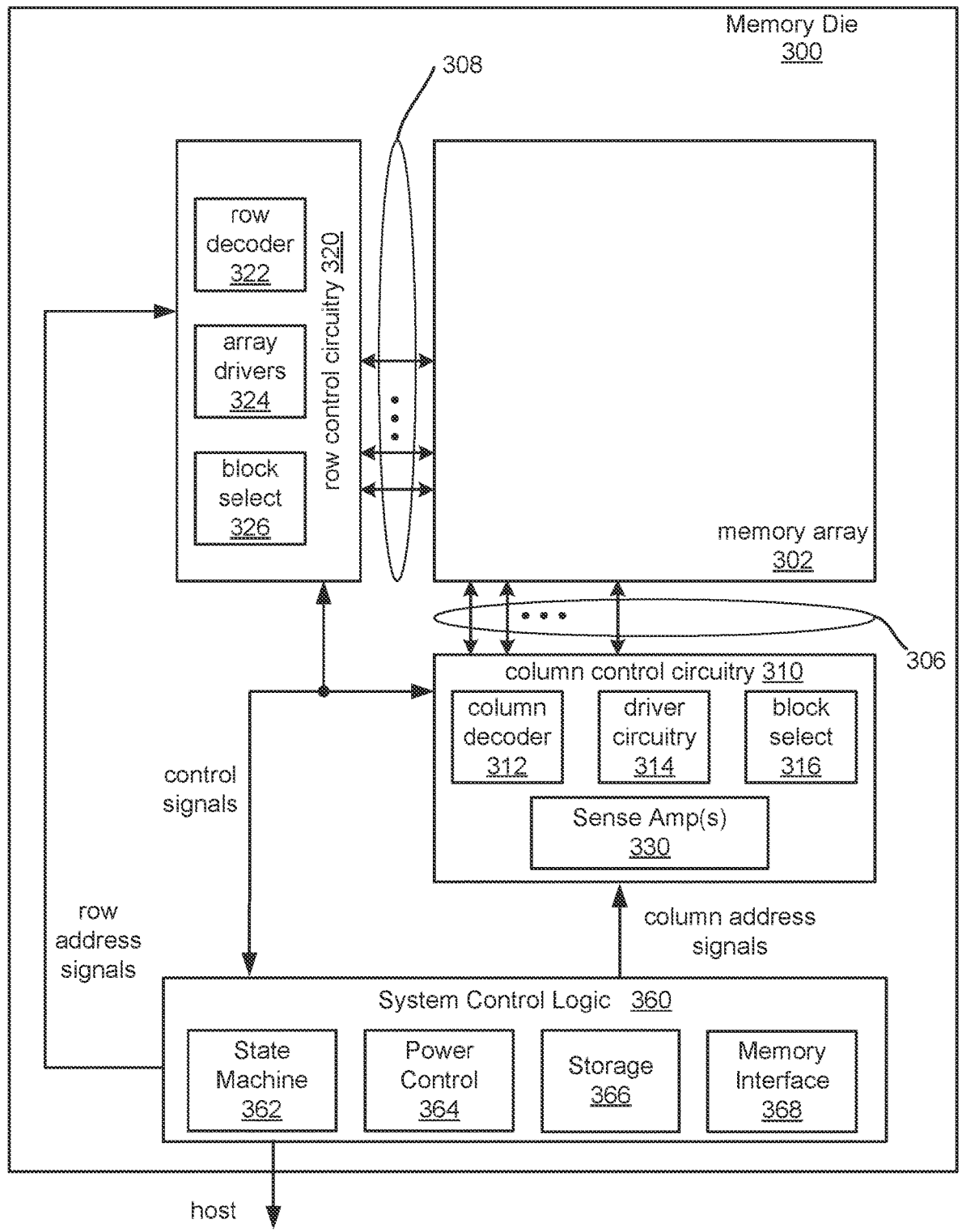
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory 302 during memory operations and may include charge pumps and regulator circuit for creating regulating voltages. System control logic 360 includes storage 366, which may be used to store parameters for operating the memory array 302.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all of the elements of memory die 300, including the system control logic 360, can be formed as part of a single die. In other embodiments, some or all of the system control logic 360 can be formed on a different die.

For purposes of this document, the phrase "one or more control circuits" can include a controller, a state machine, a micro-controller, micro-processor, and/or other control circuitry as represented by the system control logic 360, or other analogous circuits that are used to control non-volatile memory.

In one embodiment, memory structure 302 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of memory system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the memory system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
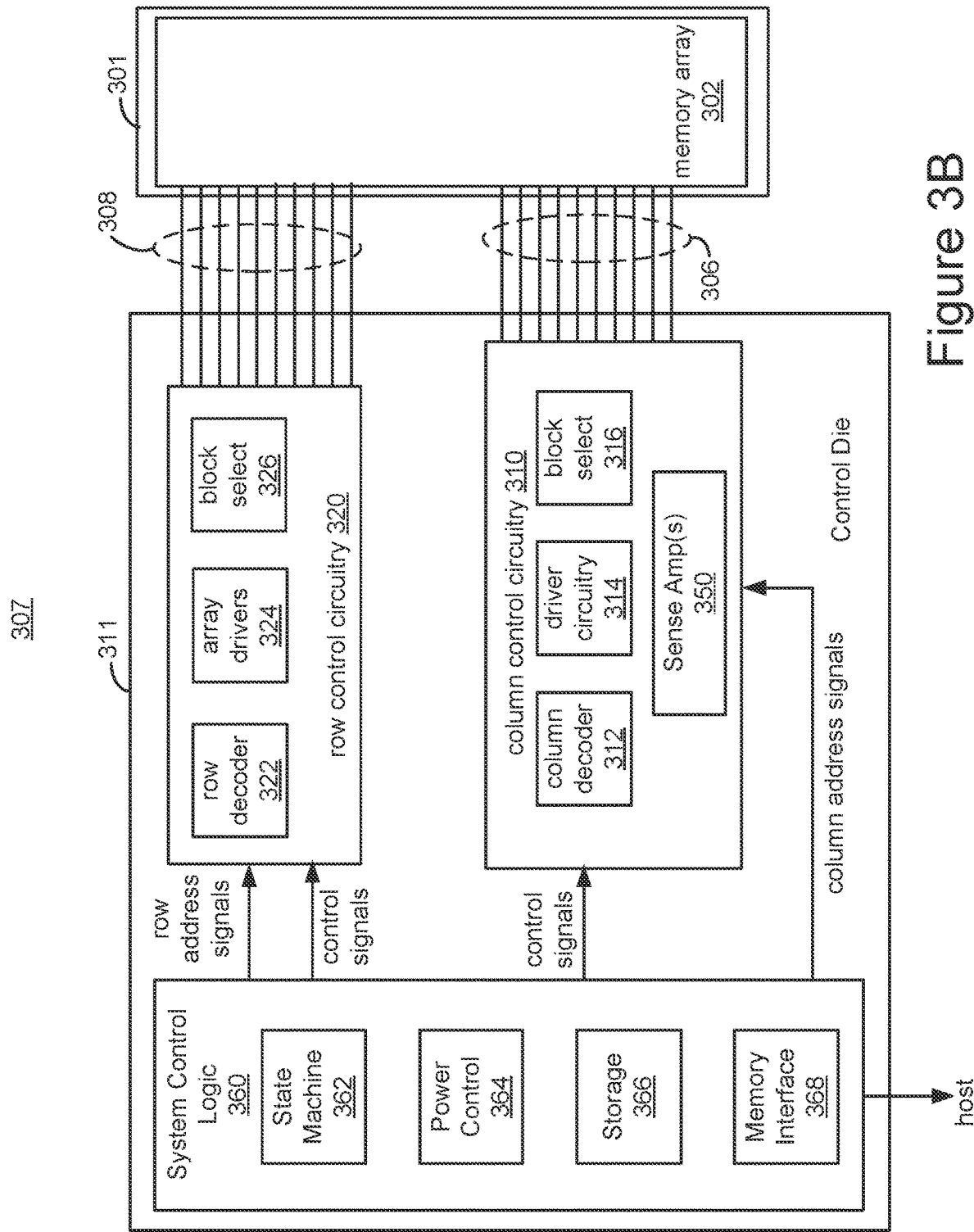
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. It can be seen that system control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "one or more control circuits" can include one or more of controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

FIG. 4 is a block diagram depicting one embodiment of a sense block 402. An individual sense block 402 is partitioned into one or more core portions, referred to as sense circuits or sense amplifiers 350(1)-350(4), and a common portion, referred to as a managing circuit 480. The sense amplifiers 350 may be used during read or verify operations. In some embodiments, the sense amplifiers 350 are used during in-memory computing. For example, the sense amplifiers 350 may be used during vector/matrix multiplication. Hence, in-memory computing operations such as vector/matrix multiplication may be considered to be sensing operations. However, the sense amplifiers 350 may be operated in a different manner for in-memory computing than for read or verify operations. In one embodiment, the sense amplifiers 350 are used to distinguish between sub-threshold currents during vector/matrix multiplication.

In one embodiment, there will be a separate sense circuit for each bit line/NAND string and one common managing circuit 480 for a set of multiple, e.g., four or eight, sense circuits. Each of the sense circuits in a group communicates with the associated managing circuit via data bus 454. Thus, there are one or more managing circuits which communicate with the sense circuits of a set of storage elements (memory cells).

The sense amplifier 350(1), as an example, comprises sense circuitry 460 that performs sensing by determining whether a conduction current in a connected bit line is above or below a predetermined threshold level. The sensing can occur in a read or verify operation. The sense circuit also supplies a bit line voltage during the application of a program voltage in a program operation. Note that other circuitry (e.g., power control 364 under control of state machine 362) may control the application of voltages to the word lines during read or program. Thus, state machine 362 may control power control 364 to control the timing of read reference voltages (as well as other voltages) to the word lines.

The sense circuitry 460 may include a Vbl selector 462, at least one sense node 464, a comparison circuit 466 and a trip latch 468. In some embodiments, there are multiple sense nodes 464 with one of the sense nodes used for read or verify operations, and a different sense node used for in-memory computing. In some embodiments of in-memory computing, the currents that are sensed are sub-threshold currents and hence can be quite small. Hence, the sense node for in-memory computing may have a different capacitance than the sense node for read and verify.

During the application of a program voltage, the Vbl selector 462 can pass a program enable voltage (e.g., V_pgm_enable) or a program-inhibit voltage (e.g., Vbl_inh) to a bit line connected to a memory cell. Program inhibit voltages are applied to bit lines coupled to memory cells that are not to be programmed and/or bit lines having memory cells that have reached their respective target threshold voltage through execution of a programming process. These may be referred to as "unselected bit lines." When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 470 (e.g., an NMOS) can be configured as a pass gate to pass Vbl from the Vbl selector 462, by setting the control gate voltage of the transistor sufficiently high, e.g., higher than the Vbl passed from the Vbl selector. For example, a selector 472 may pass a power supply voltage Vdd, e.g., 3-4 V to the control gate of the transistor 470.

The sense amplifier 350(1) is configured to control the timing of when the voltages are applied to the bit line. During sensing operations such as read, verify, and multiply operations, the bit line voltage is set by the transistor 470 based on the voltage passed by the selector 472. The bit line voltage is roughly equal to the control gate voltage of the transistor minus its Vt (e.g., 3 V). For example, if Vbl+Vt is passed by the selector 472, the bit line voltage will be Vbl. This assumes the source line is at 0 V. Also, note that the bit line voltage may be somewhat different where the bit line connects to the NAND string relative to the bit line voltage at the sense amplifier. The transistor 470 clamps the bit line voltage according to the control gate voltage and acts as a source-follower rather than a pass gate. The Vbl selector 462 may pass a relatively high voltage such as Vdd which is higher than the control gate voltage on the transistor 470 to provide the source-follower mode. During sensing, the transistor 470 thus charges up the bit line.

In one approach, the selector 472 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, in one embodiment, the sense node 464 is charged up to an initial voltage such as Vsense_init. The sense node is then connected to the bit line via the transistor 470, and an amount of decay of the voltage on the sense node is used to determine whether a memory cell is in a conductive or non-conductive state. In one embodiment, a current that flows in the bit line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the processor 482.

The managing circuit 480 comprises a processor 482, four example sets of data latches 484, 485, 486, 487 and an I/O Interface 488 coupled between the sets of data latches and data bus 318 (data bus may connect to the memory controller 102). One set of data latches, e.g., comprising individual latches LDL, MDL, UDL, and QDL, can be provided for each sense amplifier. In some cases, fewer or additional data latches may be used. LDL stores a bit for a lower page of data, MDL stores a bit for a middle page of data, UDL stores a bit for an upper page of data, and QDL can be used in the coarse/fine or quick pass write technique described below. This is in a sixteen level or four bits per memory cell memory device. In one embodiment, there are eight levels or three bits per memory cell.

The processor 482 performs computations, such as to determine the data stored in the sensed memory cell and store the determined data in the set of data latches. The processor 482 may also determine a magnitude of a sub-threshold current in a NAND string. Each set of data latches 484-487 may be used to store data bits determined by processor 482 during a read operation, and to store data bits imported from the data bus 318 during a program operation which represent write data meant to be programmed into the memory. The data latches 484-487 could also be used to store a value that represents a result of in-memory computing (e.g., multiplication). I/O interface 488 provides an interface between data latches 484-487 and the data bus 318. The processor 482 may also be used to determine what voltage to apply to the bit line, based on the state of the latches.

During reading, verify, and in-memory computing, the operation of the system is under the control of state machine 362 that controls the supply of different control gate voltages to the addressed memory cell. For a read or verify operation, as it steps through the various predefined control gate voltages corresponding to the various memory states supported by the memory, the sense circuit may trip at one of these voltages and a corresponding output will be provided from sense circuit to processor 482 via the data bus 454. At that point, processor 482 determines the resultant memory state by consideration of the tripping event(s) of the sense circuit and the information about the applied control gate voltage from the state machine 362 via input lines 490. It then computes a binary encoding for the memory state and stores the resultant data bits into data latches 484-487.

For an embodiment of in-memory computing operation, the control gate voltages do not correspond to the various memory states. As will be discussed below, the control gate voltages may be sub-threshold voltages, which are below the threshold voltages of the memory cells. The magnitude of the sub-threshold voltage is used to represent the magnitude of an element in an input vector. Hence, the state machine 362 does not need to step through different control gate voltages for an embodiment of in-memory computing. Instead, the state machine 362 applies a sub-threshold voltage having an appropriate magnitude for an element of the input vector. Moreover, the state machine 362 may simultaneously apply an appropriate sub-threshold voltage to the control gates of all memory cells on the NAND string. Therefore, the sense amplifier 350 may be used to sense the combined sub-threshold currents of all memory cells on the NAND string.

Herein, the phrase "apply a sub-threshold voltage to a memory cell," means that the voltage that is applied to the control gate of the memory cell is less than the Vt of the memory cell. Hence, a sub-threshold voltage is defined in terms of the Vt of the memory cell to which it is applied. Herein, the phrase "apply a sub-threshold voltage to a word line," means that the voltage that is applied to the word line is less than the Vt of essentially all of the memory cells connected to the word line. There may be a few memory cells connected to the word line having a Vt below the sub-threshold voltage due to, for example, the nature of programming the memory cells to target Vts not being a perfect process.

Some implementations can include multiple processors 482. In one embodiment, each processor 482 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense amplifiers, the state machine needs to read the wired-OR line four times, or logic is added to processor 482 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 484-487 from the data bus 318, in the LDL, MDL, UDL, and QDL latches, in a four-bit per memory cell implementation.

The program operation, under the control of the state machine, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 482 monitors the read back memory state relative to the desired memory state. When the two are in agreement, the processor 482 sets the bit line in a program inhibit mode such as by updating its latches. This inhibits the memory cell coupled to the bit line from further programming even if additional program pulses are applied to its control gate.

Each set of data latches 484-487 may be implemented as a stack of data latches for each sense amplifier. In one embodiment, there are three data latches per sense amplifier 350. In some implementations, the data latches are implemented as a shift register so that the parallel data stored therein is converted to serial data for data bus 318, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 5A:
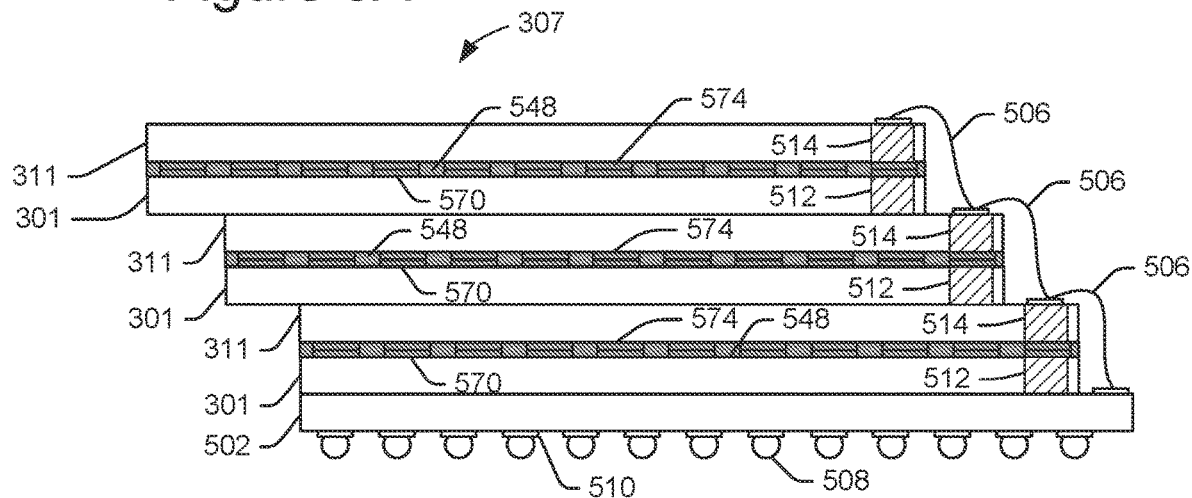
FIG. 5A depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control die 311 and multiple memory structure die 301. FIG. 5A depicts a side view of an embodiment of an integrated memory assembly 307 stacked on a substrate 502 (e.g., a stack comprising control dies 311 and memory structure dies 301). The integrated memory assembly 307 has three control dies 311 and three memory structure dies 301. In some embodiments, there are more than three memory structure dies 301 and more than three control die 311.

Each control die 311 is affixed (e.g., bonded) to at least one of the memory structure dies 301. Some of the bond pads 570, 574, are depicted. There may be many more bond pads. A space between two dies 301, 311 that are bonded together is filled with a solid layer 548, which may be formed from epoxy or other resin or polymer. This solid layer 548 protects the electrical connections between the dies 301, 311, and further secures the dies together. Various materials may be used as solid layer 548, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 506 connected to the bond pads connect the control die 311 to the substrate 502. A number of such wire bonds may be formed across the width of each control die 311 (i.e., into the page of FIG. 5A).

A memory structure die through silicon via (TSV) 512 may be used to route signals through a memory structure die 301. A control die through silicon via (TSV) 514 may be used to route signals through a control die 311. The TSVs 512, 514 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 508 may optionally be affixed to contact pads 510 on a lower surface of substrate 502. The solder balls 508 may be used to electrically and mechanically couple the integrated memory assembly 307 to a host device such as a printed circuit board. Solder balls 508 may be omitted where the integrated memory assembly 307 is to be used as an LGA package. The solder balls 508 may form a part of the interface between the integrated memory assembly 307 and the memory controller 102.

Figure 5B:
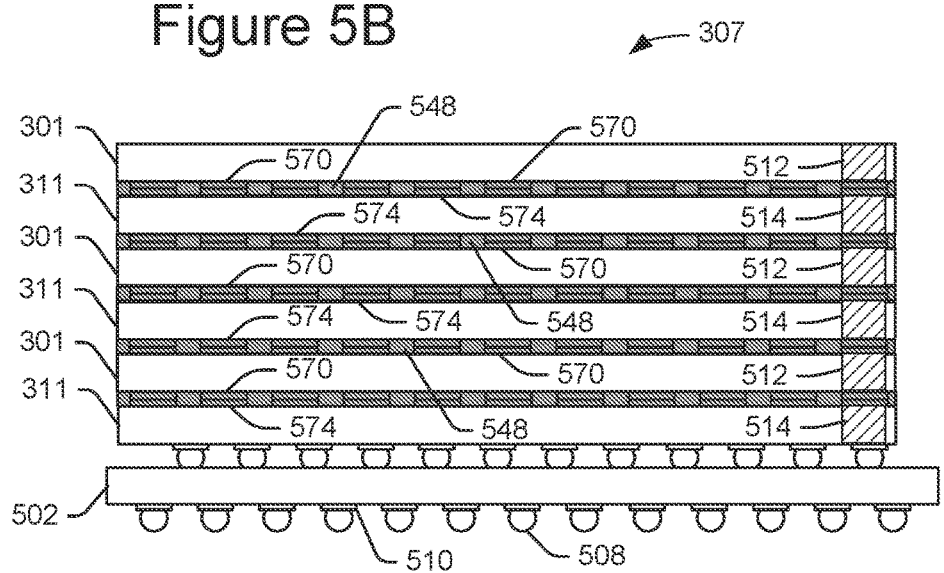
FIG. 5B depicts a side view of an embodiment of an integrated memory assembly stacked on a substrate.

FIG. 5B depicts a side view of an embodiment of an integrated memory assembly 307 stacked on a substrate 502.

The integrated memory assembly 307 has three control die 311 and three memory structure die 301. In some embodiments, there are many more than three memory structure dies 301 and many more than three control dies 311. In this example, each control die 311 is bonded to at least one memory structure die 301. Optionally, a control die 311 may be bonded to two memory structure die 301.

Some of the bond pads 570, 574 are depicted. There may be many more bond pads. A space between two dies 301, 311 that are bonded together is filled with a solid layer 548, which may be formed from epoxy or other resin or polymer. In contrast to the example in FIG. 5A, the integrated memory assembly 307 in FIG. 5B does not have a stepped offset. A memory structure die through silicon via (TSV) 512 may be used to route signals through a memory structure die 301. A control die through silicon via (TSV) 514 may be used to route signals through a control die 311.

Solder balls 508 may optionally be affixed to contact pads 510 on a lower surface of substrate 502. The solder balls 508 may be used to electrically and mechanically couple the integrated memory assembly 307 to a host device such as a printed circuit board. Solder balls 508 may be omitted where the integrated memory assembly 307 is to be used as an LGA package.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5µm to 5µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5µm square and spaced from each other with a pitch of 1µm to 5µm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material, but in embodiments, it may be Hysol epoxy resin from Henkel Corp., having offices in California, USA.

Figure 6A:
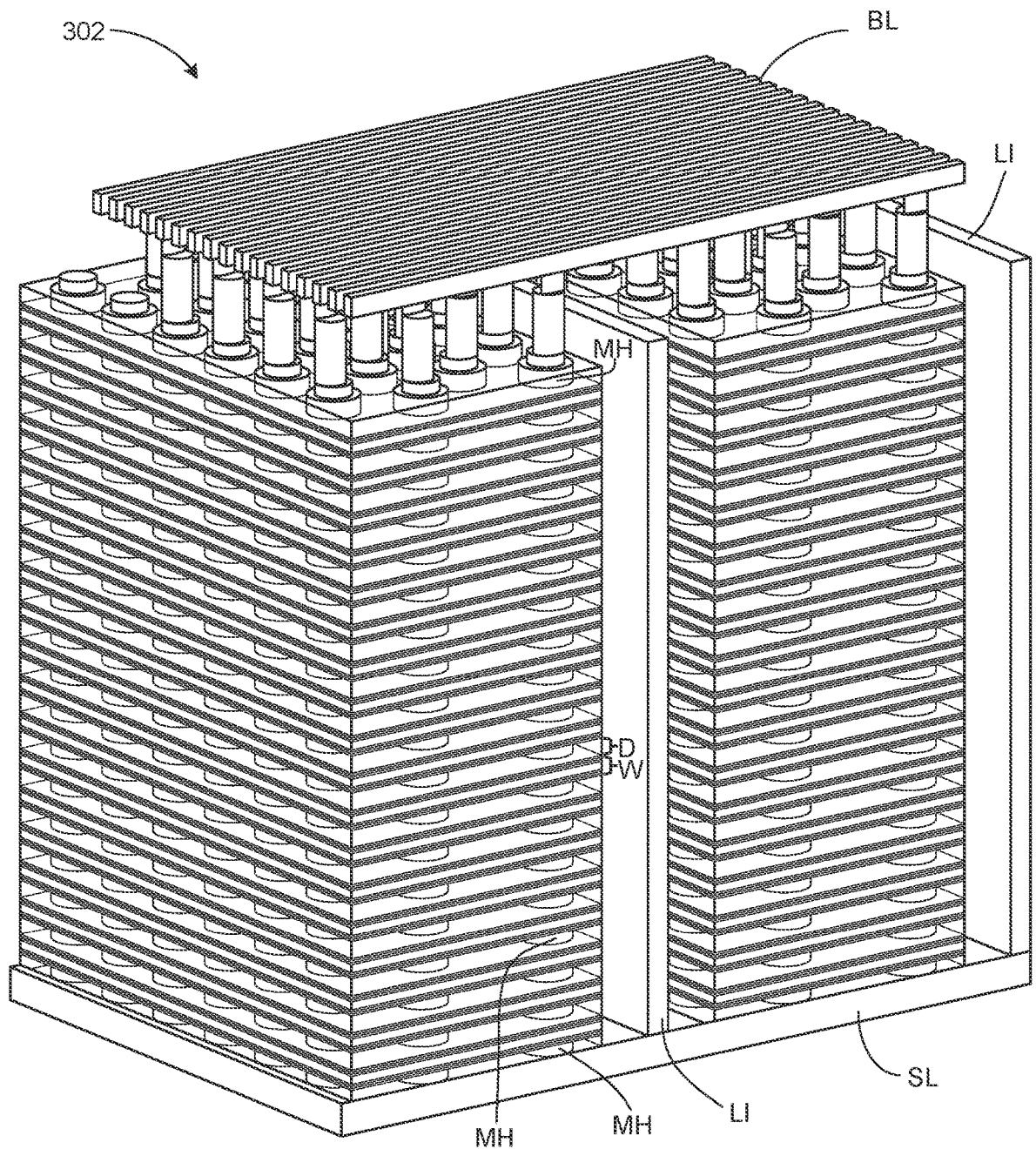
FIG. 6A is a perspective view of a portion of one example embodiment of a monolithic three dimensional memory array that can comprise memory structure.

FIG. 6A is a perspective view of a portion of one example embodiment of a monolithic three dimensional memory array that can comprise memory structure 302, which includes a plurality non-volatile memory cells. For example, FIG. 6A shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 6A shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 6A, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

FIG. 6B is a block diagram explaining one example organization of memory structure 302, which is divided into two planes 602 and 604. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 602 includes block 0, 2, 4, 6, . . . and plane 604 includes blocks 1, 3, 5, 7, . . . In on embodiment, a block of memory cells is a unit of erase. That is, all memory cells of a block are erased together. In other embodiments, memory cells can be grouped into blocks for other reasons, such as to organize the memory structure 302 to enable the signaling and selection circuits.

Figure 6C:
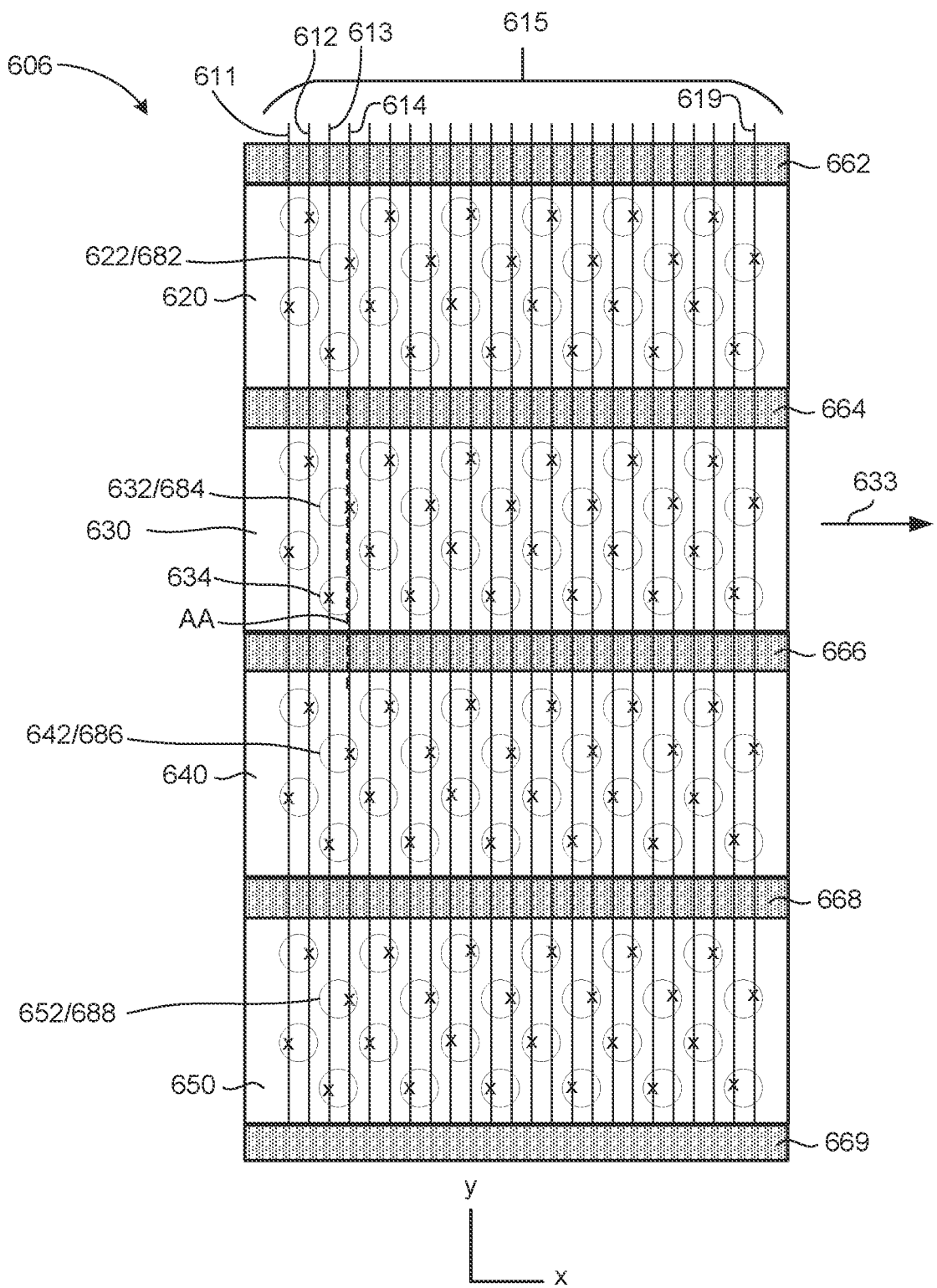
FIG. 6C is a block diagram depicting a top view of a portion of one block from the memory structure.
Figure 6D:
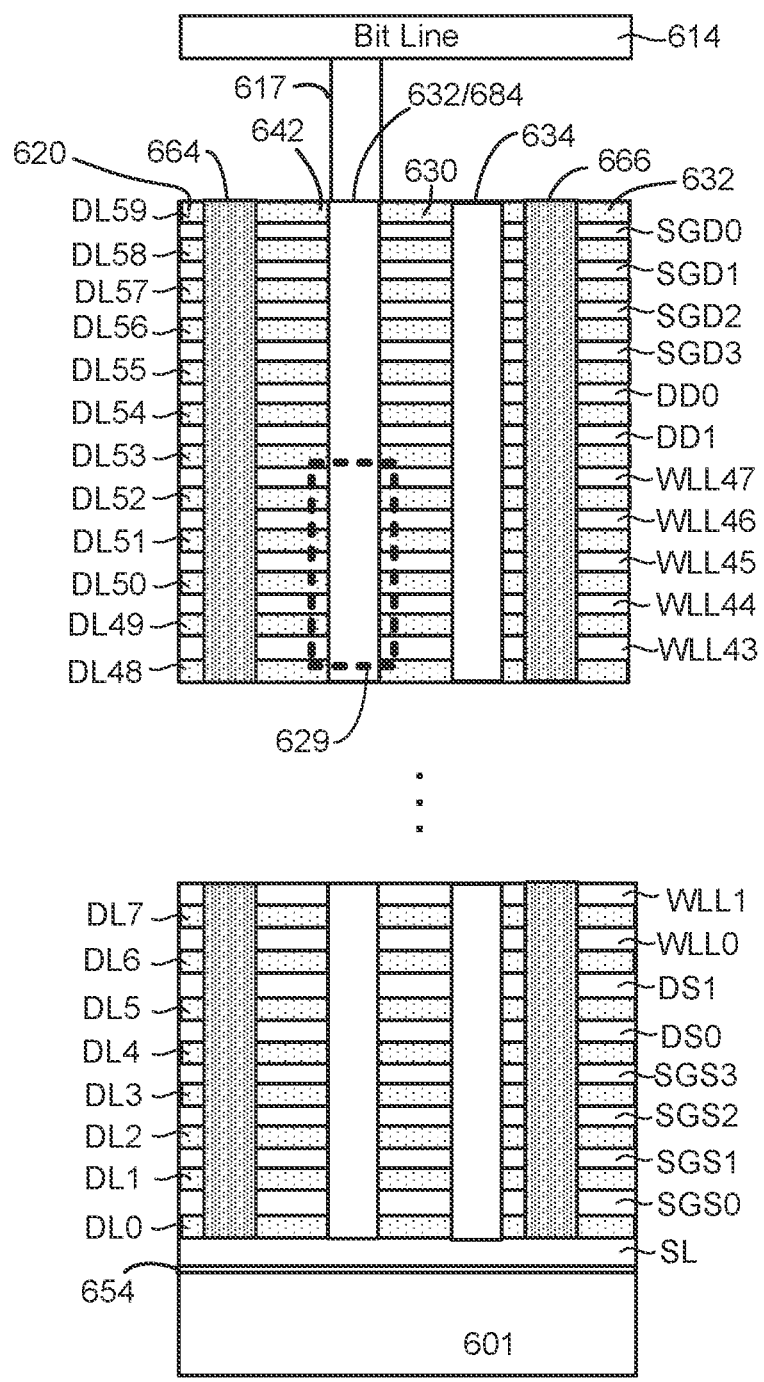
FIG. 6D depicts a portion of an embodiment of three dimensional memory structure showing a cross-sectional view along line AA of FIG. 6C.
Figure 6E:
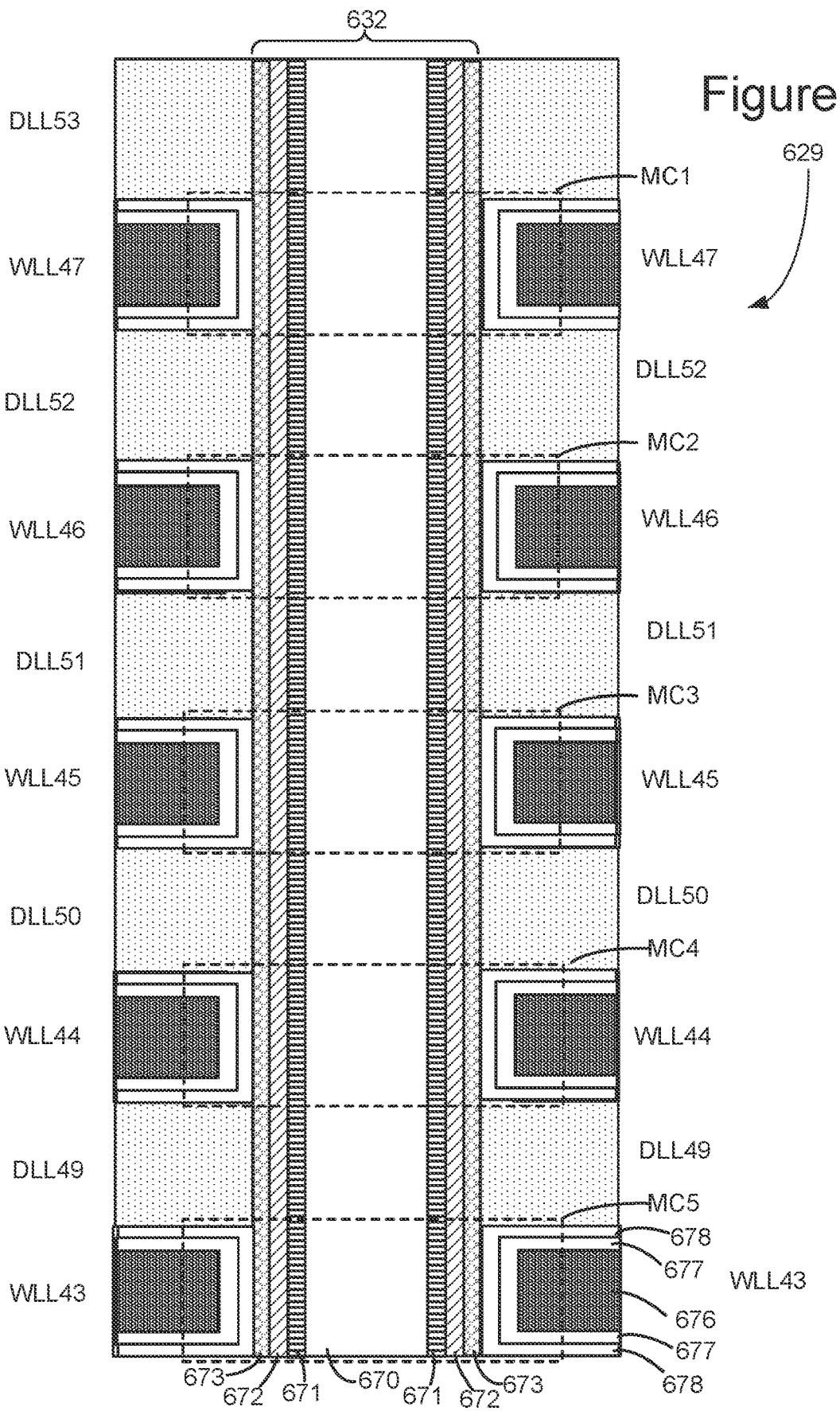
FIG. 6E depicts a cross sectional view of region of FIG. 6D that includes a portion of a vertical column.

FIGS. 6C-6E depict an example 3D NAND structure. FIG. 6C is a block diagram depicting a top view of a portion of one block from memory structure 302. The portion of the block depicted in FIG. 6C corresponds to portion 606 in block 2 of FIG. 6B. As can be seen from FIG. 6C, the block depicted in FIG. 6C extends in the direction of 633. In one embodiment, the memory array will have 60 layers. Other embodiments have less than or more than 60 layers. However, FIG. 6C only shows the top layer.

FIG. 6C depicts a plurality of circles that represent the vertical columns. Each of the vertical columns include multiple select transistors and multiple memory cells. In one embodiment, each vertical column implements a NAND string. For example, FIG. 6C depicts vertical columns 622, 632, 642 and 652. Vertical column 622 implements NAND string 682. Vertical column 632 implements NAND string 684. Vertical column 642 implements NAND string 686. Vertical column 652 implements NAND string 688. More details of the vertical columns are provided below. Since the block depicted in FIG. 6C extends in the direction of arrow 633 and in the direction of arrow 633, the block includes more vertical columns than depicted in FIG. 6C.

FIG. 6C also depicts a set of bit lines 615, including bit lines 611, 612, 613, 614, . . . 619. FIG. 6C shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 614 is connected to vertical columns 622, 632, 642 and 652.

The block depicted in FIG. 6C includes a set of local interconnects 662, 664, 666, 668 and 669 that connect the various layers to a source line below the vertical columns. Local interconnects 662, 664, 666, 668 and 669 also serve to divide each layer of the block into four regions; for example, the top layer depicted in FIG. 6C is divided into regions 620, 630, 640 and 650, which are referred to as fingers or sub-blocks. In the layers of the block that implement memory cells, the four regions are referred to as word line sub-blocks that are separated by the local interconnects. In one embodiment, the word line sub-blocks on a common level of a block connect together at the end of the block to form a single word line. In another embodiment, the word line sub-blocks on the same level are not connected together. In one example implementation, a bit line only connects to one vertical column in each of regions 620, 630, 640 and 650. In that implementation, each block has sixteen rows of active columns and each bit line connects to four rows in each block. In one embodiment, all of four rows connected to a common bit line are connected to the same word line (via different word line sub-blocks on the same level that are connected together); therefore, the system uses the source side select lines and the drain side select lines to choose one (or another subset) of the four to be subjected to a memory operation (program, verify, read, and/or erase).

Although FIG. 6C shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 6C also shows the vertical columns being staggered. In other embodiments, different patterns of staggering can be used. In some embodiments, the vertical columns are not staggered.

FIG. 6D depicts a portion of an embodiment of three dimensional memory structure 302 showing a cross-sectional view along line AA of FIG. 6C. This cross sectional view cuts through vertical columns 632 and 634 and region 630 (see FIG. 6C). The structure of FIG. 6D includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or fewer than four dummy word line layers, and more or fewer than forty eight word line layers (e.g., 96 word line layers). Vertical columns 632 and 634 are depicted protruding through the drain side select layers, source side select layers, dummy word line layers and word line layers. In one embodiment, each vertical column comprises a NAND string. For example, vertical column 632 comprises NAND string 684. Below the vertical columns and the layers listed below is substrate 601, an insulating film 654 on the substrate, and source line SL. The NAND string of vertical column 632 has a source end at a bottom of the stack and a drain end at a top of the stack. As in agreement with FIG. 6C, FIG. 6D show vertical column 632 connected to Bit Line 614 via connector 617. Local interconnects 664 and 666 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

In some embodiments, the word lines are read sequentially, which means that the word lines are read either from low to high (e.g., WLL0 to WLL47) or from high to low (e.g., WLL47 to WLL0). It is not required to read the entire set of word lines when reading sequentially. Techniques are disclosed herein for providing compensation for interference caused by adjacent memory cells on target memory cells during a sequential read.

In some embodiments, the read of an individual word line is broken down into separate reads of sub-blocks. Referring again to FIG. 6C, the block is divided into four sub-blocks 620, 630, 640, 650. Thus, the four sub-blocks on one word line layer may be read, prior to reading the four sub-blocks on an adjacent word line layer. In some embodiments, data state information is used to provide compensation on a sub-block basis. For example, data state information for memory cells at WLL35 is kept for each of the four sub-blocks 620-650. Then, when reading sub-block 620 at WLL36 the data state information for sub-block 620 at WLL35 is used to compensate for interference from adjacent memory cells in sub-block 620 at WLL35, when reading sub-block 630 at WLL36 the data state information for sub-block 630 at WLL35 is used to compensate for interference from adjacent memory cells in sub-block 620 at WLL35, etc.

FIG. 6E depicts a cross sectional view of region 629 of FIG. 6D that includes a portion of vertical column 632. In one embodiment, the vertical columns are round and include four layers; however, in other embodiments more or less than four layers can be included and other shapes can be used. In one embodiment, vertical column 632 includes an inner core layer 670 that is made of a dielectric, such as $SiO_2$. Other materials can also be used. Surrounding inner core 670 is polysilicon channel 671. Materials other than polysilicon can also be used. Note that it is the channel 671 that connects to the bit line. Surrounding channel 671 is a tunneling dielectric 672. In one embodiment, tunneling dielectric 672 has an ONO structure. Surrounding tunneling dielectric 672 is charge trapping layer 673, such as (for example) Silicon Nitride. Other memory materials and structures can also be used. The technology described herein is not limited to any particular material or structure.

FIG. 6E depicts dielectric layers DLL49, DLL50, DLL51, DLL52 and DLL53, as well as word line layers WLL43, WLL44, WLL45, WLL46, and WLL47. Each of the word line layers includes a word line region 676 surrounded by an aluminum oxide layer 677, which is surrounded by a blocking oxide ($Sio_2$) layer 678. The physical interaction of the word line layers with the vertical column forms the memory cells. Thus, a memory cell, in one embodiment, comprises channel 671, tunneling dielectric 672, charge trapping layer 673, blocking oxide layer 678, aluminum oxide layer 677 and word line region 676. For example, word line layer WLL47 and a portion of vertical column 632 comprise a memory cell MC1. Word line layer WLL46 and a portion of vertical column 632 comprise a memory cell MC2. Word line layer WLL45 and a portion of vertical column 632 comprise a memory cell MC3. Word line layer WLL44 and a portion of vertical column 632 comprise a memory cell MC4. Word line layer WLL43 and a portion of vertical column 632 comprise a memory cell MC5. In other architectures, a memory cell may have a different structure; however, the memory cell would still be the storage unit.

Note that the charge trapping layer 673 may extend from one end of the NAND string to the other, and hence may be referred to herein as a continuous charge trapping layer. When a memory cell is programmed, electrons are stored in a portion of the charge trapping layer 673 which is associated with the memory cell. These electrons are drawn into the charge trapping layer 673 from the channel 671, through the tunneling dielectric 672, in response to an appropriate voltage on word line region 676. The Vt of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 6F:
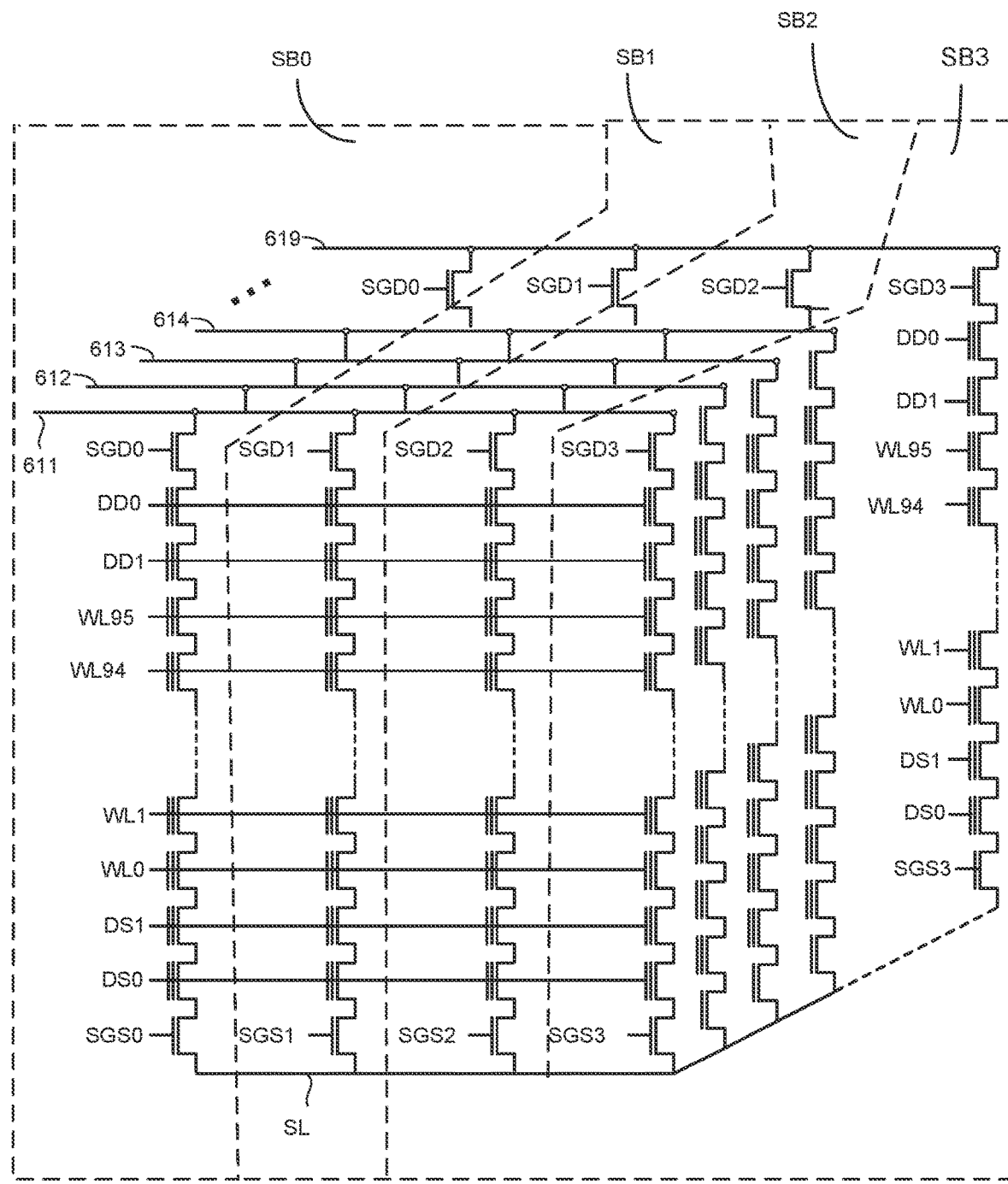
FIG. 6F is a schematic of a plurality of NAND strings showing multiple sub-blocks.

FIG. 6F is a schematic diagram of a portion of the memory depicted in in FIGS. 6A-6E. FIG. 4F shows physical word lines WLL0-WLL95 running across the entire block. The structure of FIG. 4F corresponds to portion 606 in Block 2 of FIGS. 6A-6E, including bit lines 611, 612, 613, 614, . . ., 619. Within the block, each bit line is connected to four NAND strings. Drain side selection lines SGD0, SGD1, SGD2 and SGD3 are used to determine which of the four NAND strings connect to the associated bit line(s). Source side selection lines SGS0 , SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 6A-6F is a three dimensional memory structure that includes vertical NAND strings with charge-trapping material, other (2D and 3D) memory structures can also be used with the technology described herein.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate.

FIG. 7A is a graph of threshold voltage versus number of memory cells, and illustrates example threshold voltage distributions for the memory array when each memory cell stores one bit of data. FIG. 7A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." Memory cells that store one bit of data are referred to as single level cells ("SLC").

FIG. 7B is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). Memory cells that store more than one bit of data are referred to as multi-level cells ("MLC"). FIG. 7B shows eight threshold voltage distributions, corresponding to eight data states. For a data state N, that data state N has higher threshold voltages than data state N-1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed data states. In some embodiments, data states S1-S7 can overlap, with controller 122 relying on error correction to identify the correct data being stored.

FIG. 7B shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . .) a memory cell is in. In FIG. 7A, read reference voltage Vr is used to test whether memory cells are erased or programmed.

FIG. 7B also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv 1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 7B represent the full sequence programming. The technology described herein can also be used with other types of programming in addition to full sequence programming including (but not limited to) multiple stage/phase programming.

Each threshold voltage distribution (data state) of FIG. 7B corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 7C is a table describing one example of an assignment of data values to data states. In the table of FIG. 7B, S0=111 (erased state), S1=110, S2=100, S3=000, 54=010, 55=011, 56=001 and 57=101. Other encodings of data can also be used. No particular data encoding is required by the technology disclosed herein. In one embodiment, when a block is subjected to an erase operation, all memory cells are moved to data state S0, the erased state. Referring back to FIG. 4, the LDL, MDL, and UDL data latches can respectively be used for the lower, middle, and upper page data values of a memory cell during a program operation.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g. see verify reference voltages Vv1, Vv2, Vv3, Vv4, Vv5, Vv6, and Vv7 of FIG. 6) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 8:
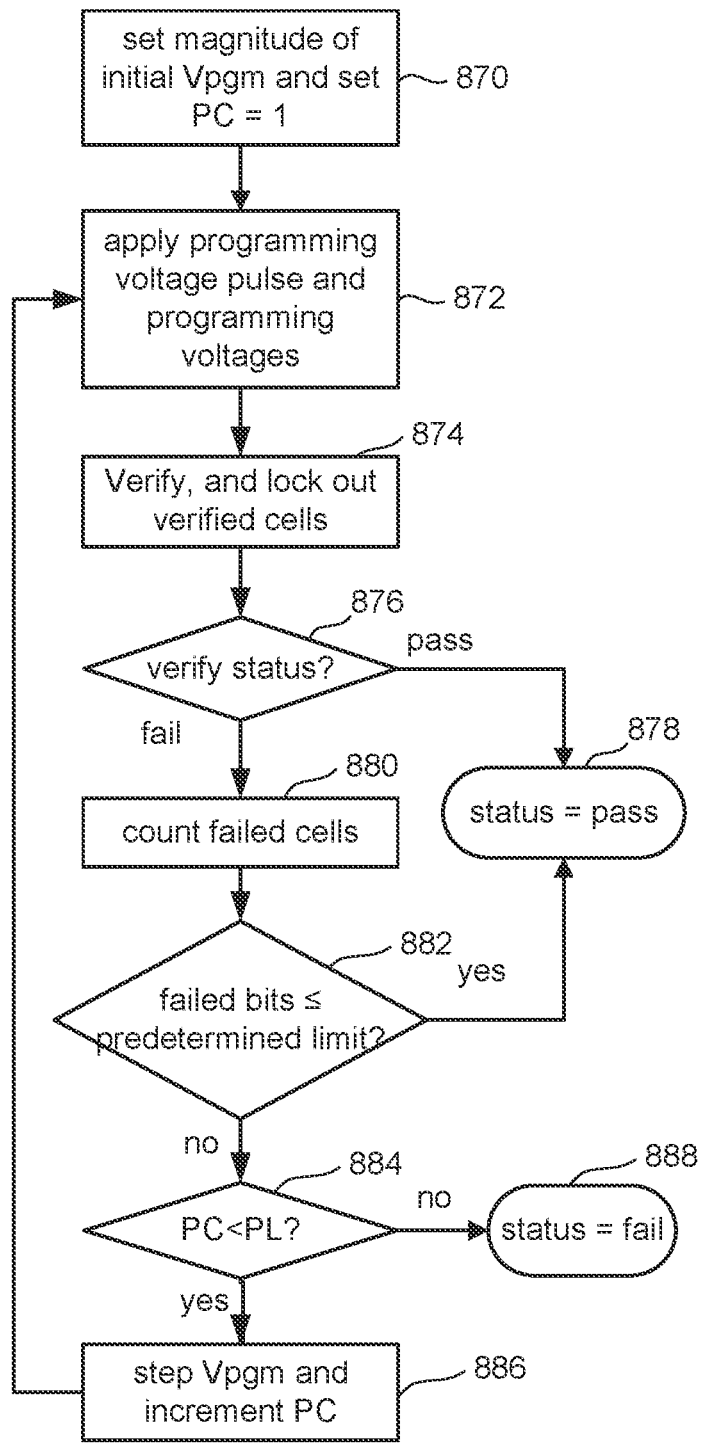
FIG. 8 is a flow chart describing one embodiment of a process for programming non-volatile memory.

FIG. 8 is a flowchart describing one embodiment of a process for programming that is performed by memory die 300/307. In one example embodiment, the process of FIG. 8 is performed on memory die 300/307 using the control circuit discussed above, at the direction of state machine 362. The process of FIG. 8 is performed to implement the programming of FIG. 7A, the full sequence programming of FIG. 7B, or other programming schemes including multi-stage programming. When implementing multi-stage programming, the process of FIG. 8 is used to implement any/each stage of the multi-stage programming process.

Figure 9:
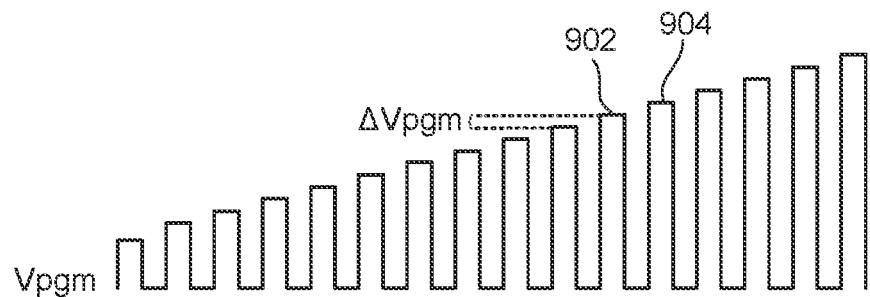
FIG. 9 depicts a series of programming voltage pulses.

Typically, a programming signal Vpgm is applied to the control gates (via a selected word line) during a program operation as a series of programming voltage pulses, as depicted in FIG. 9. Between programming pulses are a set of verify pulses to perform verification. In many implementations, the magnitude of the program pulses is increased with each successive pulse by a predetermined step size ΔVpgm (e.g., 0.2 v-0.5 v). In step 870 of FIG. 8, the programming voltage (Vpgm) is initialized to the starting magnitude (e.g., ~12-16 V or another suitable level) and a program counter PC maintained by state machine 362 is initialized at 1.In step 872, a program pulse of the programming signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd (e.g., 1-3.5 volts) to inhibit programming. In step 872, the programming voltage pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 874, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 876, it is determined whether all the memory cells have reached their target threshold voltages (pass). If so, the programming process is complete and successful because all selected memory cells were programmed and verified to their target states. A status of "PASS" (or success) is reported in step 878. If, in 876, it is determined that not all of the memory cells have reached their target threshold voltages (fail), then the programming process continues to step 880.

In step 880, the system counts the number of memory cells that have not yet reached their respective target threshold voltage distribution. That is, the system counts the number of memory cells that have, so far, failed the verify process. This counting can be done by the state machine 362, the controller 102, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 882, it is determined whether the count from step 880 is less than or equal to a predetermined limit. In one embodiment, the predetermined limit is a number of bits that can be corrected by error correction codes (ECC) during a read process for the page of memory cells. If the number of failed cells is less than or equal to the predetermined limit, then the programming process can stop and a status of "PASS" is reported in step 878. In this situation, enough memory cells programmed correctly such that the few remaining memory cells that have not been completely programmed can be corrected using ECC during the read process. In some embodiments, step 880 will count the number of failed cells for each sector, each target data state or other unit, and those counts will individually or collectively be compared to one or more thresholds in step 882.

In one embodiment, the predetermined limit can be less than the total number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 884 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 888. If the program counter PC is less than the program limit value PL, then the process continues at step 886 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 886, the process loops back to step 872 and another program pulse is applied to the selected word line so that another iteration (steps 872-886) of the programming process of FIG. 8 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the memory system), also referred to as information bits, that is to be stored non-volatile memory structure 302. The informational bits are represented by the matrix i=[1 0] (note that two bits are used for example purposes only, and many embodiments have code words longer than two bits). An error correction coding process (such as any of the processes mentioned above or below) is implemented by ECC engine 226/256 of controller 102 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R.G.

Gallager, "Low-density parity-check codes," IRE Trans. Inform. Theory, vol. IT-8, pp. 21 28, Jan. 1962; and D. MacKay, Information Theory, Inference and Learning Algorithms, Cambridge University Press 2003, chapter 47. In practice, such LDPC codes are typically applied (e.g., by ECC engine 226/256) to multiple pages encoded across a number of storage elements, but they do not need to be applied across multiple pages. The data bits can be mapped to a logical page and stored in memory structure 302 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells.

In one embodiment, the GIDL current is generated by causing a drain-to-gate voltage at a select transistor. A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 10:
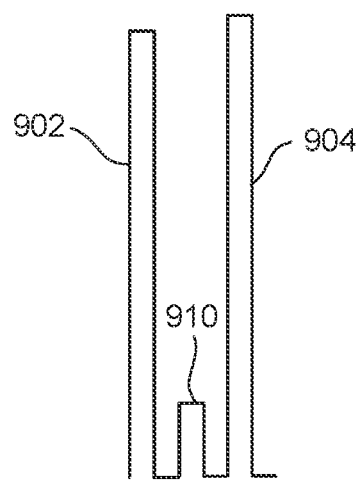
FIG. 10 depicts a two programming voltage pulses and a verify voltage pulse.
Figure 11:
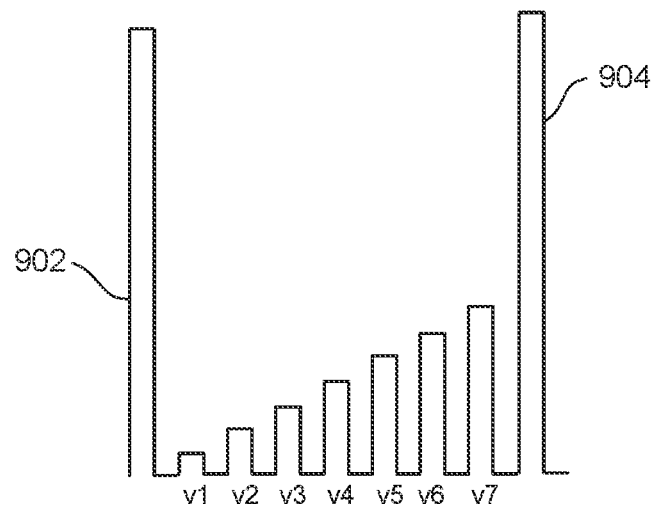
FIG. 11 depicts a two programming voltage pulses and a set of verify voltage pulses.

As discussed above, FIG. 9 depicts the programming signal Vpgm as a series of programming voltage pulses. These programming voltage pulses are one example of doses of programming applied to a plurality of non-volatile memory cells being programmed to a data state. As described by FIG. 8, the system performs program verification between the doses of programming, as depicted in FIGS. 10 and 11. FIG. 10, which illustrates an embodiment in which memory cells store one bit of data per memory cell, depicts two of the programming voltage pulses 902 and 904 of FIG. 9. Between programming voltage pulses 902 and 904 is verify voltage pulse 910. In one embodiment, verify voltage pulse 910 has a magnitude of Vv (see FIG. 7A) and represents the system performing program verification (step 874) between the doses of programming (successive iterations of step 872).

FIG. 11, which illustrates an embodiment in which memory cells store three bits of data per memory cell, depicts two of the programming voltage pulses 902 and 904 of FIG. 9. Between programming voltage pulses 902 and 904 are verify voltage pulses v1, v2,v3, v4, v5, v6 and v7. In one embodiment, verify voltage pulse v1 has a magnitude of Vv1 (see FIG. 7B), verify voltage pulse v2 has a magnitude of Vv2, verify voltage pulse v3 has a magnitude of Vv3, verify voltage pulse v4 has a magnitude of Vv4, verify voltage pulse v5 has a magnitude of Vv5, verify voltage pulse v6 has a magnitude of Vv6, and verify voltage pulse v7 has a magnitude of Vv7. Verify voltage pulses v1, v2, v3, v4, v5, v6 and v7 represent the system performing program verification (step 874) between the doses of programming (successive iterations of step 872).

Figure 12:
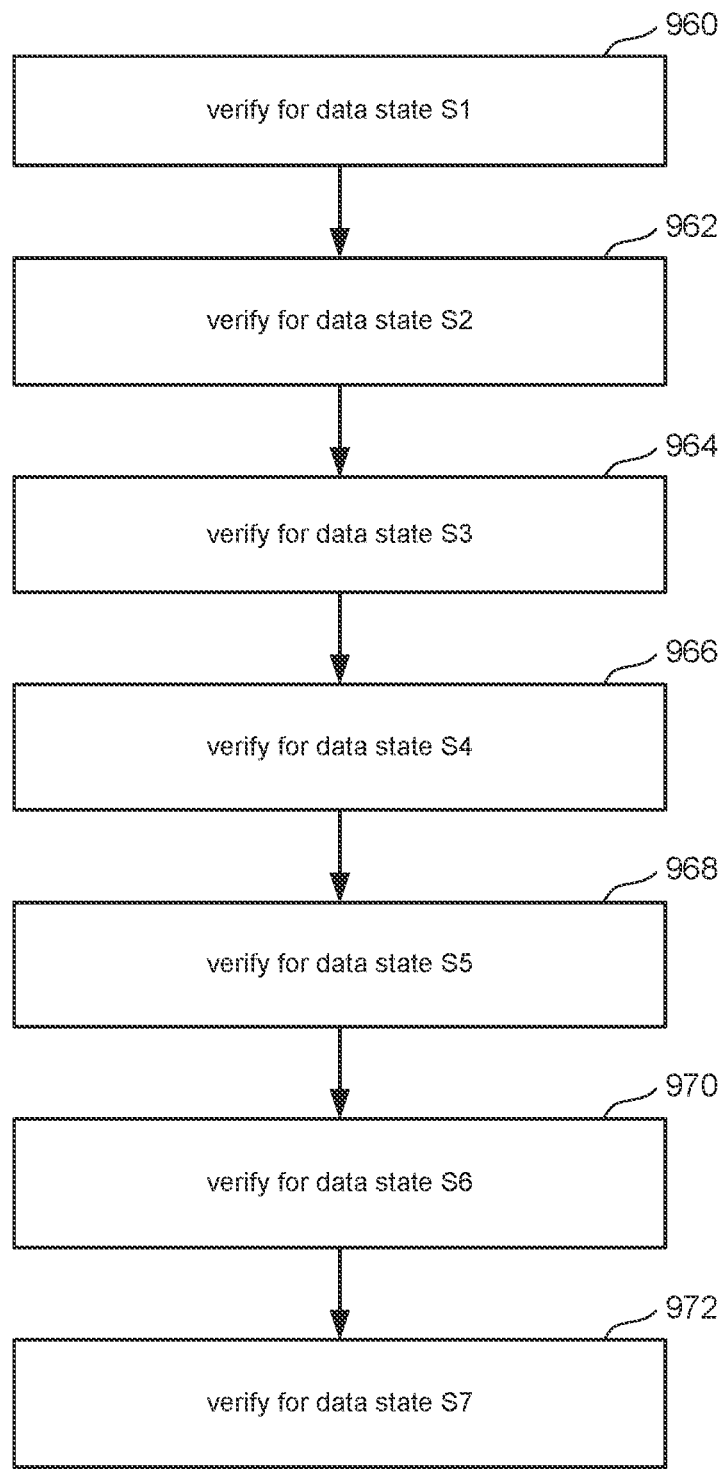
FIG. 12 is a flow chart describing one embodiment of a process for verifying programming of non-volatile memory.

FIG. 12 is a flow chart describing one embodiment of a process for verifying programming of non-volatile memory. That is, the process of FIG. 12 is a process performed during an example implementation of step 874 of FIG. 8 for an embodiment in which memory cells store three bits of data per memory cell. The process of FIG. 12 is performed using the waveforms of FIGS. 9 and 11. In step 960 of FIG. 12, the system performs verification for data state S1. For example, the system tests whether memory cells being programmed to data state S1 have threshold voltages greater than Vvl (e.g., applying verify voltage pulse v1 of FIG. 11 to the control gates of memory cells being programmed to data state Si).

In step 962, the system performs verification for data state S2. For example, the system tests whether memory cells being programmed to data state S2 have threshold voltages greater than Vv2 (e.g., applying verify voltage pulse v2 of FIG. 11 to the control gates of memory cells being programmed to data state S2).

In step 964, the system performs verification for data state S3. For example, the system tests whether memory cells being programmed to data state S3 have threshold voltages greater than Vv3 (e.g., applying verify voltage pulse v3 of FIG. 11 to the control gates of memory cells being programmed to data state S3).

In step 966, the system performs verification for data state S4. For example, the system tests whether memory cells being programmed to data state S4 have threshold voltages greater than Vv4 (e.g., applying verify voltage pulses v4 of FIG. 11 to the control gates of memory cells being programmed to data state S4).

In step 968, the system performs verification for data state S5. For example, the system tests whether memory cells being programmed to data state S5 have threshold voltages greater than Vv5 (e.g., applying verify voltage pulses v5 of FIG. 11 to the control gates of memory cells being programmed to data state S5).

In step 970, the system performs verification for data state S6. For example, the system tests whether memory cells being programmed to data state S6 have threshold voltages greater than Vv6 (e.g., applying verify voltage pulse v6 of FIG. 11 to the control gates of memory cells being programmed to data state S6).

In step 972, the system performs verification for data state S7. For example, the system tests whether memory cells being programmed to data state S7 have threshold voltages greater than Vv7 (e.g., applying verify voltage pulse v7 of FIG. 11 to the control gates of memory cells being programmed to data state S7). Note that, in one embodiment, steps 960-972 are performed between doses of programming (e.g., between programming voltage pulses). In some embodiments, one or more of steps 960-972 can be skipped between certain programming voltage pulses. In one embodiment, steps 960-972 are performed sequentially (in any order or in the order depicted), while in other embodiments steps 960-972 are performed in parallel (e.g., concurrently).

The flow of FIG. 12 illustrates the verification of all of the target data states, but to speed up the verification phase of a programming operation a "smart verify" operation can be used. In a smart verify, not all of the target data state levels are checked. Initially, for the first few programming pulses, only the lower data states need to be checked. As the programming operation continues, as the lower target data states begin to verify, additional higher data states are included; and, as the lower states finish, the lower target state verifies can be dropped out.

Figure 13A:
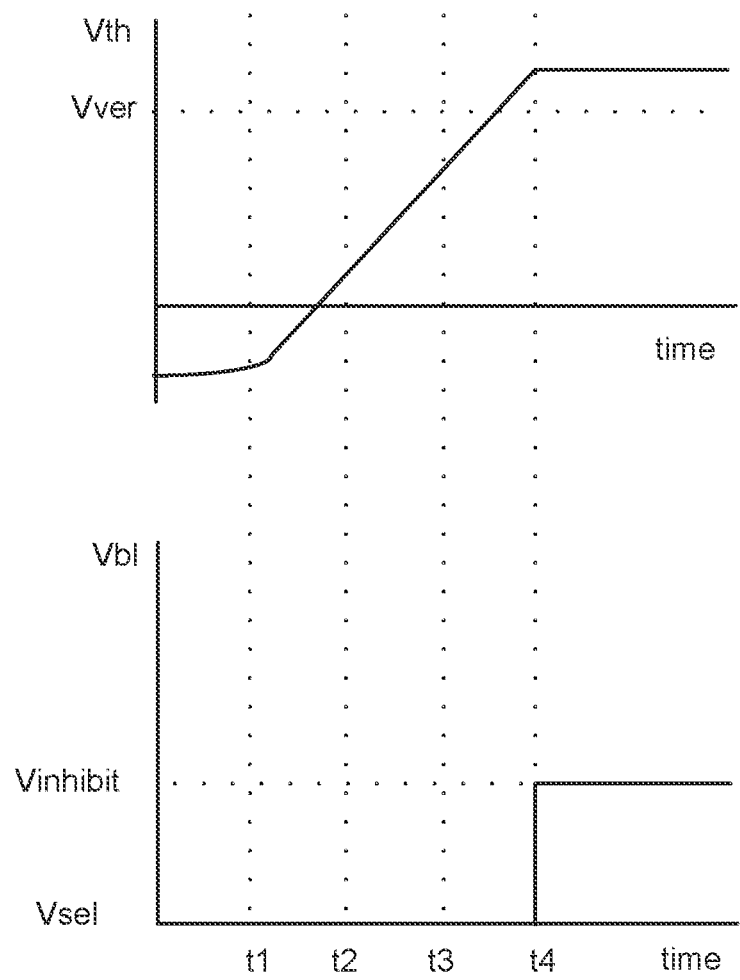
FIG. 13A is a graph describing the bit line voltage during a programming process.

One means of verifying the programming is to test conduction at a specific compare point (e.g., verify reference voltage). Program selected memory cells that are verified to be sufficiently programmed are locked out, for example, by raising the bit line voltage from a low, program enable voltage Vsel of 0, for example, to a high program inhibit voltage Vinhibit of Vdd, for example, to stop the programming process for those memory cells. For example, FIG. 13A depicts graphs of threshold voltage (Vth) versus time and bit line voltage (Vbl) versus time. While a memory cell is receiving the program voltage Vpgm of FIG. 9 at its control gate, the threshold voltage of the memory cell increases over the interval t1-t4.

When the threshold voltage of the memory cell reaches the verify reference voltage Vver (e.g., any of Vv, Vv1, Vv2, Vv3, Vv4, Vv5, Vv6, and Vv7 of FIGS. 7A and 7B, as appropriate)) at t4, then the bit line voltage is raised to Vinhibit (e.g., Vdd).

When programming and verifying as depicted in FIG. 13A, there is a tradeoff between speed of programming and precision of programming. The precision of programming is related to the distribution of threshold voltages of the programmed memory cells subsequent to the programming process. The tighter the threshold voltage distribution, the easier it is to unambiguously read the memory cells. The need for tight threshold voltage distributions is even more important with multi-level memory cells storing multiple bits of data because the read process needs to unambiguously distinguish between the different threshold voltage distributions (e.g., for data states S1-S7). To obtain a tight threshold voltage distribution, a smaller step size can be used for the program voltage Vpgm. However, using a smaller step size slows down the programming process.

An improvement to the programming process is depicted in FIG. 13B, which can be referred to as a coarse/fine programming process, also known as Quick Pass Write (QPW). The process of FIG. 13B applies the program voltage signal Vpgm of FIG. 9 to the control gates of the memory cells to be programmed. Between the programming voltage pulses, verify operations are performed. If, as during t1-t3, the threshold voltage of the memory cell being programmed is less than an intermediate verify reference voltage VverI, the programming continues for that memory cell with the bit line voltage remaining low (e.g., 0 volts). This is the coarse phase of the coarse/fine programming process because the memory cells program faster. If the threshold voltage of the memory cell being programmed is higher than intermediate verify reference voltage VverI and lower than final verify reference voltage VverF, such as occurs at t3, then an intermediate bit line voltage Vint (e.g., 0.5-1.0 volts) is applied to partially inhibit the programming. (The latch QDL can be set within the sets of data latches 484, 485, 486, 487 sense circuitry for tracking the phase of the coarse/fine or quick pass write.) As a result of the intermediate bit line voltage, during the interval t3-t5, the channel voltage for the memory cell will increase and the programming of that memory cell will be slowed down because the shift in threshold voltage due to each programming voltage pulse will be reduced. This is the fine phase of the coarse/fine programming process. The bit line will remain at the intermediate bit line voltage for a number of programming voltage pulses until the threshold voltage of the memory cell reaches the final verify reference voltage VverF at t5. When the memory cell's threshold voltage reaches final verify reference voltage VverF, the bit line will be raised to inhibit further programming (e.g., by raising the bit line voltage to Vinhibit (e.g., Vdd, which can be 1-5 volts). Note that the final verify reference voltage VverF corresponds to the verify reference voltage for the data state that the memory cells are being programmed to. For example, during step 960 (see FIG. 12), final verify reference voltage VverF corresponds to Vv1; during step 962, final verify reference voltage VverF corresponds to Vv2; during step 964, final verify reference voltage VverF corresponds to Vv3; during step 966, final verify reference voltage VverF corresponds to Vv4; during step 968, final verify reference voltage VverF corresponds to Vv5; during step 970, final verify reference voltage VverF corresponds to Vv6; and during step 972, final verify reference voltage VverF corresponds to Vv7. In one embodiment, the intermediate verify reference voltage VverI for a data state is 0.25 volts below the final verify reference voltage VverF for the data state. Other magnitudes of separation between VverI and VverF for a data sate can also be used.

Figure 14:
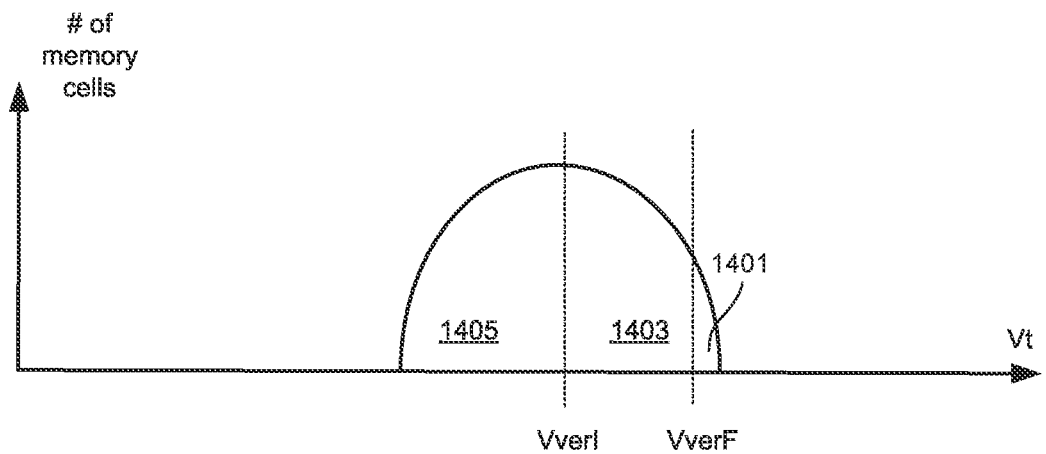
FIG. 14 is a graph of a threshold voltage distribution for a set of non-volatile memory cells being programmed.

FIG. 14 shows the threshold voltage distribution for the memory cells being programmed to a data state in coarse/fine, or quick pass write, mode using VverI and VverF. A portion 1405 of the threshold voltage distribution represents memory cells that have threshold voltages below VverI for the data state. A portion 1403 of the threshold voltage distribution represents memory cells that have threshold voltages greater VverI for the data state, but less than VverF for the data state. A portion 1401 of the threshold voltage distribution represents memory cells that have threshold voltages greater than VverF for the data state. When performing the verify operation, those memory cells being programmed to the data state that have a threshold voltage less than VverI for the data state will have their bit lines remain at Vss (e.g., 0 volts) for the next programming voltage pulse and those memory cells being programmed to the data state that have a threshold voltage greater than or equal to VverI for the data state will have their bit lines raised to Vint (e.g., 0.5 -1.0 volts) for the next programming voltage pulse, and those memory cells being programmed to the data state that have a threshold voltage greater than or equal to VverF for the data state will have their bit lines raised to Vinhibit (e.g., 1.0-5.0 volts) for the next programming voltage pulse. This allows for the portion of the memory cells 1405 to see the full strength of the programming voltage pulse, while the portion of the memory cells 1403 are partially inhibited so that they see the strength of the programming voltage pulse lessened so that they do not over program and end up in the next higher data state's distribution.

In some embodiments, testing for threshold voltages greater than or equal to VverI includes applying a first voltage pulse at VverI, and testing for threshold voltages greater than or equal to VverF includes applying a second voltage pulse at VverF. In other embodiments, the system can test for VverI and VverF with one voltage pulse but using two different sense times. For example, the system can apply a voltage pulse, sense whether the memory cells turned on after .7 microseconds for VverI and sense whether the memory cells turned on after 1.4 microseconds for VverF.

Using the approach of FIG. 13B results in the programmed threshold voltage distribution being narrower than the process of FIG. 13A because the shift per program pulse of the threshold voltage is reduced once the threshold voltage is close to the target value (e.g., when the threshold voltage is above VverI and below VverF). However, the approach of FIG. 13B slows down the programming process because each data state being verified now requires two verification operations.

The following presents techniques to further improve performance of the programming process, particularly the verification operation. The following will be discussed in the context of an embodiment as illustrated in FIG. 7B, where each memory cell can store three bits of data. In this embodiment, the highest threshold state is the S7 state. The same techniques can be similarly applied to memory devices that have multi-level memory cells (MLC) storing different number of states per cell, in which can the highest state of S7 would be instead the corresponding highest state, such as $S(2^{N-1})$ for an N-bit per memory cell embodiment.

As discussed above with respect to FIGS. 13B and 14, one motivation for the use of a coarse/fine, or quick pass write, mode is that a larger step size can be used for the programming waveform (such as illustrated in FIG. 9). The coarse/fine approach allows for memory cells that are almost, but not quite, programmed (i.e., portion 1403 of FIG. 14), to be partially inhibited so that they are not over-programmed into the next higher data state. For the S7 data state (or, more generally, the highest data state), there is no next highest state and, consequently, no overshoot problem, at least as far as having well-separated distributions for the different data states. Because of this, one way to speed up the programming process is, while still using the coarse/fine mode when verifying the states S1-S6, to only use a single verify level for the S7 state. Also, if the coarse/fine mode is not used once programming for the states through S6 complete, the QDL latches of sets of data latches 484, 485, 486, 487 (FIG. 4) are free to be put to other uses.

In a typical programming operation for a 3-bit per memory cell 3D NAND memory embodiment, completing the programming of the S7 state. This means that in many cases a write operation will need two extra loops to finish programming. One reason is due to the asymmetric distribution of natural threshold voltage Vt distribution, as illustrated in FIG. 15, where slow to program memory cells (the distribution's lower tail) can be extended over a wide that requires more than one extra programming loop for S7 state completion, as illustrated by FIG. 16.

Figure 15:
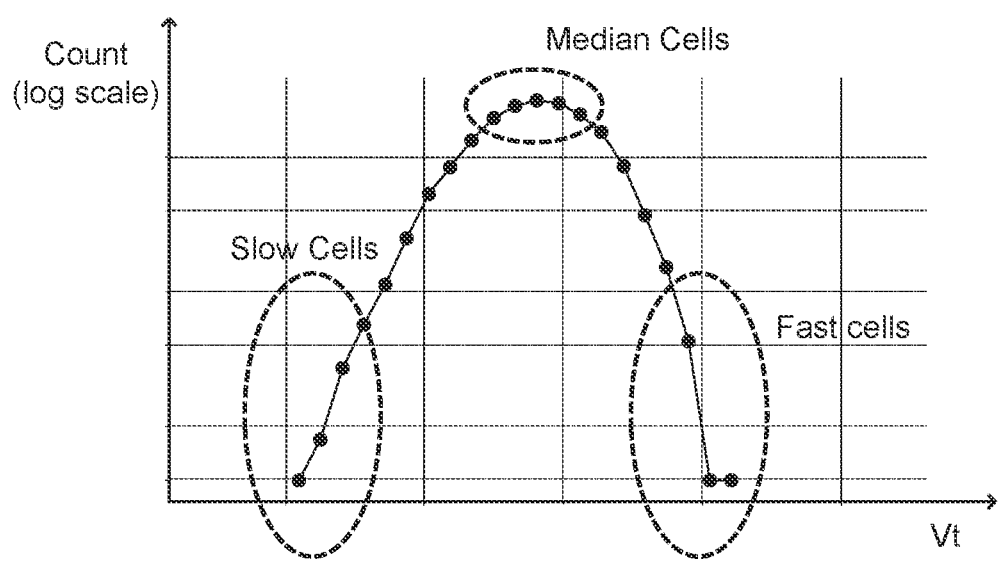
FIG. 15 illustrates a typical natural Vt distribution for the sort of 3D NAND technology discussed above with respect to FIGS. 6A-6F.

FIG. 15 illustrates a typical natural Vt distribution for the sort of 3D NAND technology discussed above with respect to FIGS. 6A-6F. The horizontal axis is a (linear) representation of the threshold voltages Vt of a population of memory cells that have undergone some number of programming pulses without program inhibit. The vertical axis is the number of memory cells at a given Vt value in a log scale. The slower to program memory cells (the lower tail of the distribution) generally show a wider distribution due to processing variation, where the more pulses that are applied, the greater the spread. As such, it generally requires more program loops to clean up the slow memory cells and program to a tight distribution around their target data state, particularly for the higher data states, such as S7.

Figure 16:
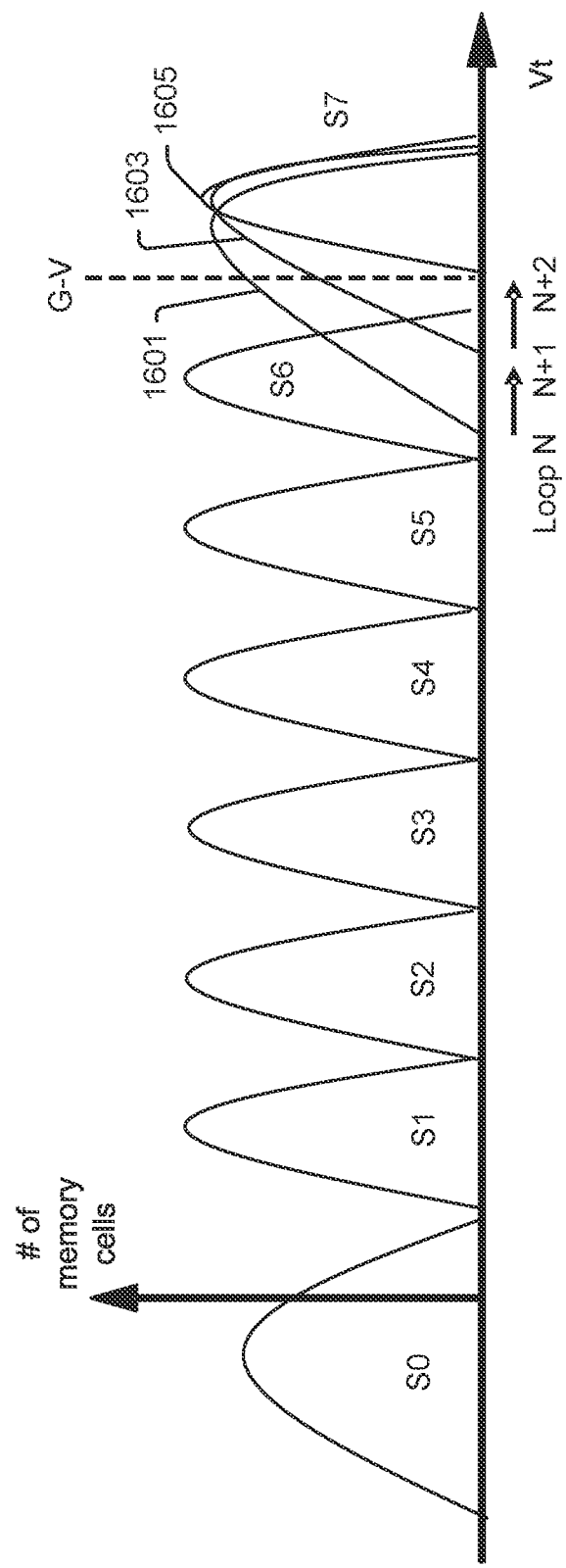
FIG. 16 illustrates distributions of memory cells after a programming event when the next-to-highest target data state for the memory cells finishes at loop N, but the highest target data state has not finished.

FIG. 16 illustrates distributions of memory cells after a programming event when the next-to-highest target data state (S6 in the example) for the memory cells finishes at loop N, but the highest target data state (S7 here) has not finished. The distribution 1601 illustrates the S7 distribution at this point, where the lower tail is pronounced. At this point, a typical implementation will use one or two additional loops, with corner cases possibly needing three additional loops. For example, if the memory cells with a target data state of S7 needs two additional loops, as shown in the distribution 1603, the S7 state's lower tail distribution will still be below Vv7 at loop N+1, but above Vv7 at loop N+2. If the S7 state can instead reliably have only one extra loop enough to finish programming to the final desired distribution 1605, the total programming loop count can be reduced by 1, improving programing performance by 5%-10%.

To reduce the number of programming loops for completing writing memory cells to the highest, S7 target data state, several methods are presented in the following discussion, where each technique can be used independently or in various combinations. As noted above, since the coarse/fine mode may be omitted once the S6 state completes programming, the QPW latch is not used once only the S7 state is left to complete. A first of these methods to reduce the number of programming loops takes advantage of this free data latch and uses it to identify and record those slow memory cells with the S7 target data state that can benefit from accelerated programming.

Another technique to reduce the number of programming loops for completing the writing memory cells to the S7 state is to, once the S6 target state finishes, to sense the S7 target state memory cells twice before a programming pulse. One sensing can be performed at the standard Vv7 verify level in order to distinguish between the fast memory cells and the median memory cells, as illustrated on the distribution of FIG. 15. Another sensing is performed at a level Vv7-$\Delta_{extra}$ to distinguish between the median memory cell population and the slow memory cells.

A further technique to reduce the number of programming loops to complete the S7 programming is to use a larger step size for the next programming pulse once the next lower state programming state (e.g., S6) is complete and only the S7 state left. If $V_{pgm}$ is the pulse strength at loop N when S6 completes and $\Delta V_{pgm}$ is the step size between $V_{pgm}$ and the previous pulses, at loop N+1 a voltage level of $V_{pgm}$+$\Delta V_{pgm}$+$\alpha\Delta_{extra}$ is applied to the selected word lines. The extra increase of $\alpha\Delta_{extra}$ in pulse size will result in an increase in the amount of Vt change for the selected memory cells. Although S7 is the highest data state and there is, consequently, not the concern of overprogramming into the next highest data state, overprogramming can still have undesirable consequences. On consequence is the possibility of increased wear, and decreased life, for the memory device due to overprogramming. Another consequence, in the NAND memory context, is that this can result in a higher pass voltage needed for non-selected word lines in order to turn on non-selected memory cells along a NAND string. To cut down on overprogramming, the slow memory cells can have their bit lines biased at the low level, such as 0V, and the median memory cells bit lines can be biased at $\Delta_{extra}$.

Yet another technique for improving performance is a faster way to perform a verify with multiple levels more quickly, such as for the Vv7 and Vv7-$\Delta_{extra}$ levels, but also more generally at other points of the programming process where multiple verify levels are performed. More specifically, the following presents a technique for detecting charges on a sensing capacitor twice (or more times) when a first plate of the capacitor is pre-charged once by using two (or more) different voltage levels on the second plate of the capacitors, so that two (or more) strobings can be performed with the capacitor following a single discharging through the selected memory cell. This can be more rapid than conventional techniques as it avoids both the re-ramping time of word lines and the bit line settling time, as well as two-times for the discharge of sensing capacitor.

Figures 17, 18:
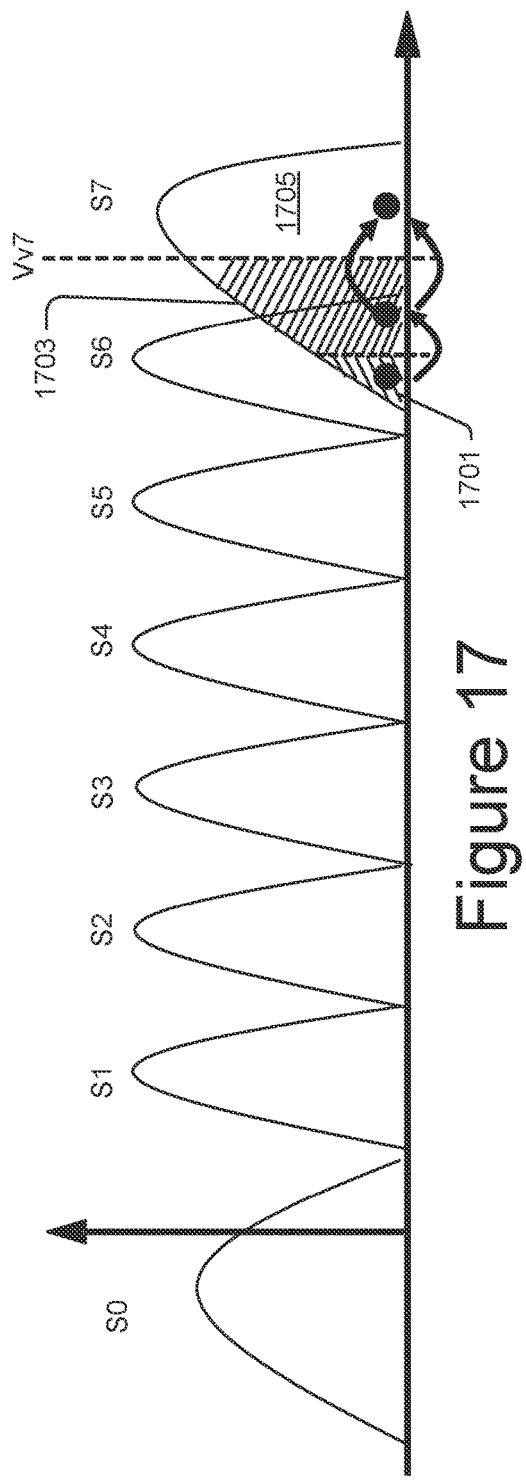
FIGS. 17 and 18 consider a three-bit per memory program operation at the point where the next-to-highest state's programming has finished in more detail.

FIGS. 17 and 18 consider a three-bit per memory program operation at the point where the S6 programming has finished in more detail. FIG. 17 again shows the distribution of threshold voltages for a 3-state per memory cell embodiment at the point in a programming operation where the S6 state programming has finished and only the S7 state programming remains. The S0-S6 distributions are well-defined, but distribution of memory cells with the S7 target state still include a lower tail of memory cells below the Vv7 verify level. The memory cells within the S7 distribution can be grouped into three types. The type 3 memory cells of the region 1701 of the S7 distribution are the slow memory cells, which are below Vv7 and also below Vv7-$\Delta_{extra}$ and will need at least two more pulses to pass the Vv7 verify level. Consequently, the slow memory cells in the region 1701 will cause at least more than one additional programming loop and degrade write performance. The region 1703 includes the median memory cells, which are below Vv7 but above Vv7-$\Delta_{extra}$ and are largely expected to be above Vv7 after the next pulse. The memory cells in the region 1705 are the fast memory cells that pass the Vv7 verify and will be program inhibited for later programming pulses.

The table of FIG. 18 summarizes this situation. The left-most column list the three data types within the S7 state distribution as described in the preceding paragraph. The next column illustrates the data latch values for the upper, middle, and lower pages for the S7 target data of (101), but where, as the fast cells will have verified, the data latches have been flipped to (111) to indicated that these memory cells will be inhibited from further programming. The third column is for the QDL value indicating whether a memory cells has passed at the lower verify level and is to partially be inhibited; but, if the coarse/fine, or quick pass write, mode is not being used for S7, these latches are free. The fourth column illustrates the word line voltages for the steps of the programming voltage waveform of $V_{pgm}$ (for the pulse at which the S6 state finishes and the fast memory cells for S7 verify and lock out), followed by $V_{pgm}+\Delta V_{pgm}$, which is in turn followed by $V_{pgm}+2*\Delta V_{pgm}$. The final column illustrates the bit line voltages for when the N+1 pulse of $V_{pgm}+\Delta V_{pgm}$ is applied, where the fast memory cells have their bit lines set to the Vinhibit level and the median and slow cells are programmed enabled by setting their bit lines at a low voltage of, for example, 0V.

As illustrated in FIGS. 17 and 18, when the next to highest state (the S6 state) finishes program, the S7 state still needs extra loops to finish. Typically, in a 3D NAND technology as illustrated above with respect to FIGS. 6A-6F, the number extra loops varies from device to device and word line to word line, with the variation varying from one to three extra loops. The techniques presented here address the type 3 slow memory cells of the region 1701 of the S7 distribution so that they can finish programming together with the median memory cells of the region 1703. Consequently, this allows for all of the memory cells having the S7 target data state to complete in one additional programming loop, rather than more than one loop, thereby improving performance.

As noted in column 3 for the approach of FIG. 18, the QDL latch is free during the S7 state formation, so it is available to identify the slow S7 state memory cells, which can then be accelerated in subsequent programming pulses. To achieve this acceleration, instead of the first programming pulse after the S6 state finishes being $V_{pgm}+\Delta V_{pgm}$, a programming pulse of $V_{pgm}+\Delta V_{pgm}+\alpha\Delta_{pgm}$ will be applied in the next pulse. For slow memory cells, which are known from the QDL latch, bit lines will be biased low (e.g., 0V), so that they will see the full effect of the $\Delta V_{pgm}+\alpha\Delta_{extra}$ increase. For median memory cells, that are again known from their corresponding QDL latch values, their bit lines will be biased at $\Delta_{extra}$ so that they get the normal $\Delta V_{pgm}$ (and not $V_{pgm}+\Delta V_{pgm}$) effect. Note that pre-factor $\alpha$ can be used to account for any non-linearity effect between the bias level on a bit line and effect of the $\alpha\Delta_{pgm}$ factor of the increased step size for the programming pulse. This is illustrated in FIGS. 19 and 20.

Figures 19, 20:
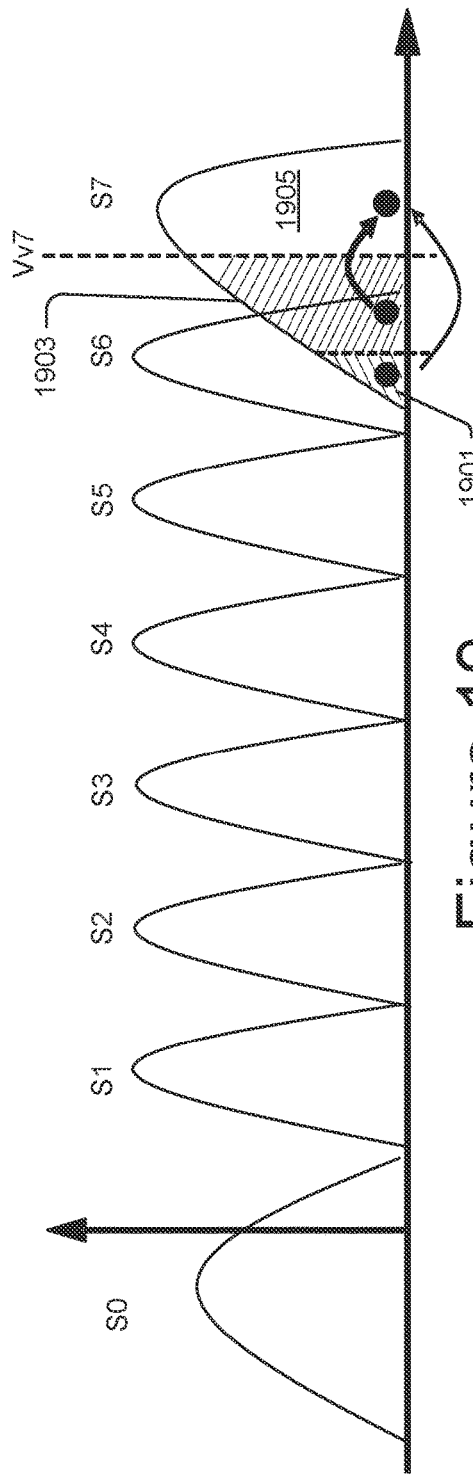
FIGS. 19 and 20 consider a three-bit per memory program operation at the point where the next-to-highest state's programming has finished and an accelerated programming is used for the highest state's programming.

FIGS. 19 and 20 consider an embodiment for a three-bit per memory program operation at the point where the S6 programming has finished in more detail, but with the accelerated programming of the S7 state. Consequently, FIGS. 19 and 20 respectively correspond to FIGS. 17 and 18, but with accelerated programming of the S7 (or more generally top-most) data state. The distribution of the memory cells with the S7 target data state again are of three types: the fast memory cells 1905 that will have verified at Vv7; the median memory cells 1903 that are below Vv7, but above Vv7-$\Delta_{extra}$; and the slow memory cells 1901 that are below Vv7-$\Delta_{extra}$. The median memory cells of the region 1905 will again move above Vv7 to region 1905. Additionally, the slow memory cells of region 1901 will jump by $\Delta V_{pgm}+\Delta_{pgm}$ and can also pass the Vv7 verify level with a single additional pulse.

The table of FIG. 20 is organized the same as FIG. 18 and the first two columns have the same values as in FIG. 18. As in FIG. 18, as the fast memory cells have verified at Vv7, the UDL/MDL/LDL data latch values flip from the target data state of S7=101 to the inhibit value of 111, with the bit line voltage for subsequent pluses set at the Vinhibit voltage level, such as a value of ~2.5 volts in one set of embodiments, while the median and slow memory cells having the UDL/MDL/LDL data latch values of target data state of S7=101. Unlike FIG. 18, in the embodiment of FIG. 20 the QDL latch is now put to use to record whether a memory cell passes a verify at Vv7-$\Delta_{extra}$ and, if not, the QDL latch is set to 1 to indicate that the memory cell is a slow memory cell. (Alternately, the encoding of the QDL values could be reversed in other embodiments.) The fourth column gives a set of the programming pulses applied to a selected word line staring at the Nth pulse of $V_{pgm}$ that is the pulse at which S6 state completes, following the next and, if needed, following accelerated pulses of $V_{pgm}+(\beta\Delta_{pgm}+\Delta V_{pgm})$ and $V_{pgm}+(\alpha\Delta_{pgm}+2*\Delta V_{pgm})$. For example, in one example for an embodiment where $\alpha=1$ and $\Delta_{pgm}=0.5$ V, these pulses would be $V_{pgm}+(0.5 V+\Delta V_{pgm})$ and $V_{pgm}+(0.5 V+2*\Delta V_{pgm})$. The right-most column lists the bit line values of Vinhibit (such as around 2.5 V) for a fast memory cell to be fully inhibited; $\Delta_{pgm}$ (such as around 0.5 V) for the median memory cells; and 0 V for the slow memory cells. Referring back to the QDL latch, note that in the assignments of FIG. 20 the QDL latch is used to keep track of slow cells, rather than being set to 1 for the fast cells that verify above VverI but below VverF as illustrated by the region 1403 of FIG. 14.

Figure 21:
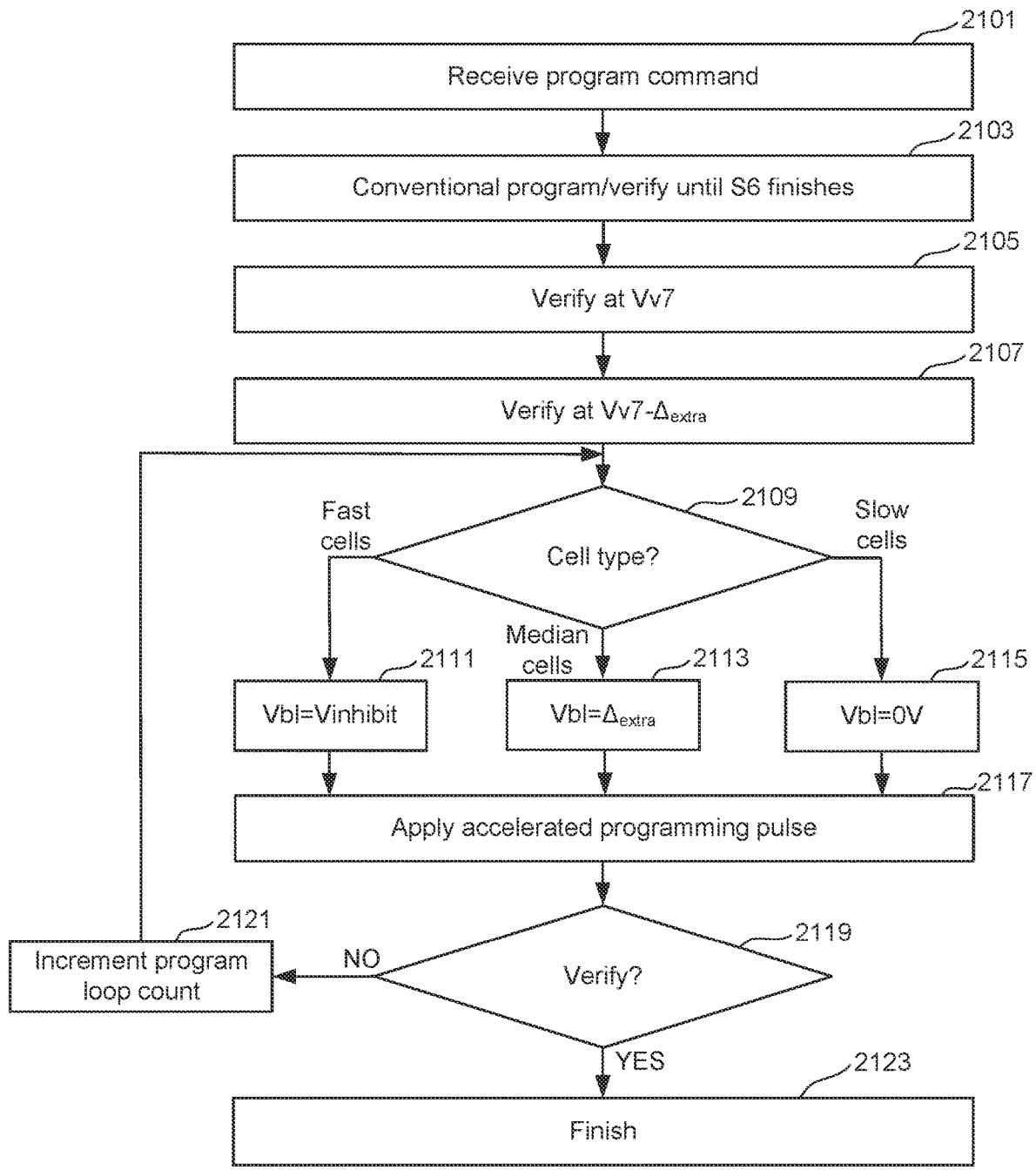
FIG. 21 is a flowchart for an embodiment using accelerated programming for the highest data state.

FIG. 21 is a flowchart for an embodiment using accelerated programming for the highest data state. Beginning at step 2101 a programming command is received. For example, referring back to FIG. 1A, a host 120 sends a command to write a data set to the memory device 100, where the memory controller 102 assigns physical addresses to the data, which are transferred to the memory packages 104 to written into memory cells of the arrays of the memory dies. The programming then begins and, at step 2103, continues in the conventional manner as described above with respect to FIG. 7A and subsequent figures, until the memory cells having the next-to-highest data state (e.g., S6) finish programming. The accelerated programming for the highest data state (e.g., S7) begins at step 2105.

Step 2105 performs a verify at the standard highest state verify level (Vv7) to determine the fast memory cells that have completed programming to the S7 target state and can be locked out from further programming. An additional verify is also performed at step 2107 to distinguish between the median memory cells and the slow memory cells using the verify level of Vv7-A$\neq_{extra}$. For example, in one embodiment, Vv7 could be 5 V and Vv7-$\Delta_{extra}$ could be 5 V-0.5 V=4.5 V. The two verify operations of steps 2105 and 2107 can be done in either order, depending on the embodiment. Additionally, they can be done by use of different control gate voltages as applied to the word line, by use of a longer sense interval for step 2107, or by the technique described below where the voltage on the lower plate of the sensing capacitor is raised for the second sensing operation.

Based upon the verify operations of steps 2105 and 2107, the memory cells having a target state of S7 can be binned as described above with respect to FIG. 20 as either fast memory cells (verifying above Vv7), median memory cells (verifying below Vv7, but above Vv7-$\Delta_{extra}$), slow memory cells (verifying below Vv7-$\Delta_{extra}$). For the fast memory cells, UDL/MDL/LDL values are switched from the S7 (101) value to the inhibit value (111), with the QDL value left at 0. For the median and slow memory cells, the UDL/MDL/LDL values stay at the target data value of S7 (101), with QDL staying a 0 for the median cells and QDL flipped to 1 for the slow memory cells. Depending on which category that the memory cell belongs to, and consequently based on the latch values, the corresponding bit is biased by the driver circuitry 314 of the column control circuitry 310 (FIGS. 3A, 3B) to the program inhibit level (step 2111) for the fast memory cells, $\Delta_{extra}$ (step 2113) for the median memory cells, or 0 V (step 2115) for the slow memory cells. Once the bit lines are biased accordingly, at step 2117 the array drivers 324 of the row control circuitry apply the accelerated programming pulse of $V_{pgm}+(\alpha\Delta_{pgm}+\Delta V_{pgm})$ to selected word lines. In most cases, this should finish the S7 program, but a verify can be performed at step 2119 to confirm this and, if confirmed, the program operation finishes at step 2123. The verify at step 2119 can again use Vv7. If any memory cells (or more memory cells than the allowable number) fail to verify, a verify at Vv7-$\Delta_{extra}$ can also be performed, the programming voltage incremented by $\Delta V_{pgm}$ to $V_{pgm}+(\alpha\Delta_{pgm}+2\Delta V_{pgm})$ at step 2121 and flow loop back to step 2109.

Figure 22:
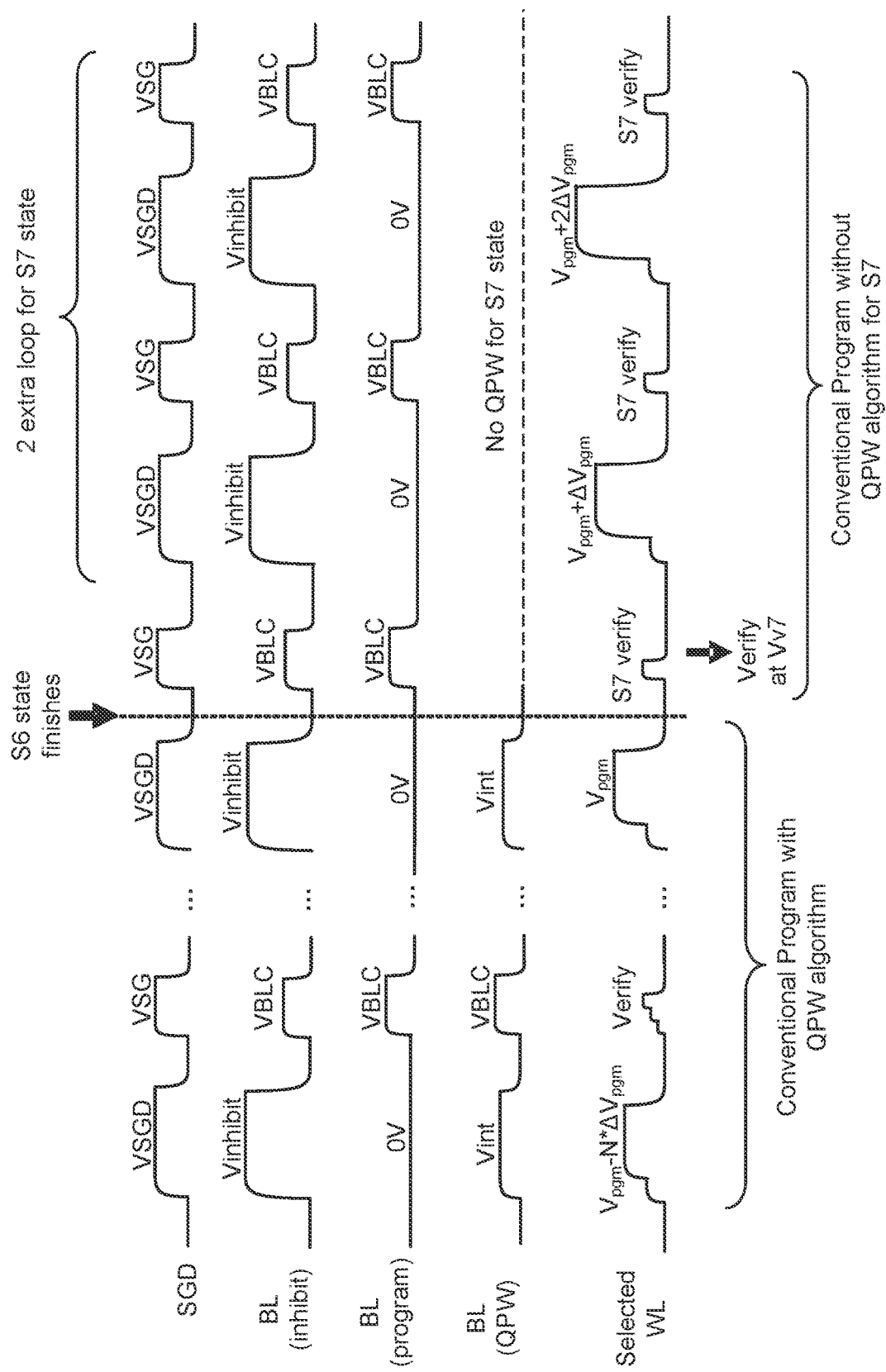
FIGS. 22 and 23 are a set of waveforms for a programming process respectively without and with accelerated programming for the highest data state.
Figure 23:
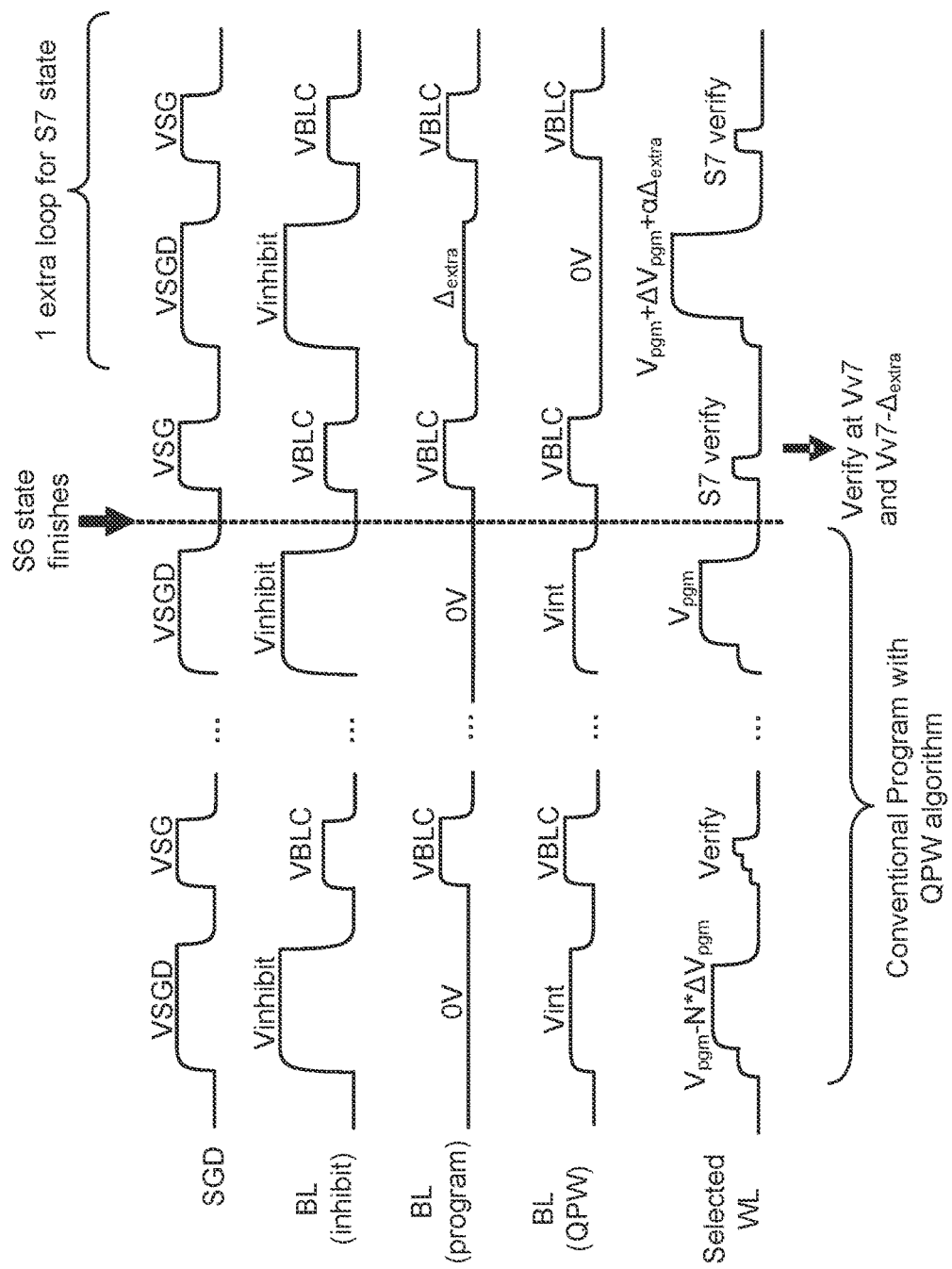

FIGS. 22 and 23 are each a set of waveforms for a programming process respectively without and with accelerated programming for the highest data state. More specifically, the waveforms of these figures show an alternating series of programming pulses applied to a selected word line, with each of the pulses followed by a verify. The programming process up to when the next to highest data (S6) verifies can be a conventional process and is the same for both FIGS. 22 and 23, where in these waveforms $V_{pgm}$ is the amplitude of the final pulse applied before the S6 state verifies, with the figures picking up the process N pulses earlier at the pulse with an amplitude of $V_{pgm}-N^*\Delta V_{pgm}$.

Staring at the top trace of FIG. 22 is the voltage applied by the row control circuitry 320 to the drain side select transistor of the NAND string, where these receive a high voltage level of VSGD during pulses and VSG during the sensing operations of the verify, but are set low in between to allow the control lines to settle. The second set of waveforms are for bit lines that are programmed inhibited, either from the outset if the target data state is S0 or after verifying at their target data state. The bit lines that are inhibited are set to Vinhibit for the programming pulses and pre-charged to a level VBLC for the sensing operation of the verifies. The third line is the bit line waveform for programmed enabled memory cells that have yet to verify, where the bit line is set to 0V (or a more general Vsel) during programming pulses and VBLC for the sensing operation of the verifies.

The fourth row is the bit line waveform for memory cells that, in the coarse/fine-or quick pass write process, pass the lower, but not the upper, verify level for the target data state. These memory cells are partially inhibited by having their bit lines set to Vint during the programming pulse, but at VBLC during the verifies. In FIG. 22, once the S6 state verifies, the coarse/fine programing is not used while the programming process continues to finish writing the S7 data state. For all three types of bit line bias waveforms, in between the programming pulses and the verifies, the bit lines are taken to ground to allow the system to settle.

The bottom line of FIG. 22 is the waveform applied to a selected word line and can be a conventional programming as described above with respect to FIGS. 7A-14, where programming pulses are alternated with verify operations. As noted above, the waveform begins N pulses before the S6 state finishes after the pulse of $V_{pgm}$ and continues on with the pulses $V_{pgm}+\Delta V_{pgm}$, $V_{pgm}+2\Delta V_{pgm}$, and, if needed, $V_{pgm}+3\Delta V_{pgm}$. For the states of S6 and below, the verify process can use both the coarse and fine verifies, but only the standard Vv7 verify for the S7 state.

FIG. 23 uses the accelerated S7 programming. FIG. 23 is the same as FIG. 22 for all waveforms up until S6 verifies, and also the same for the SGD and BL inhibit lines after S6 verifies. For the selected word line waveform, once the S6 stat finishes, the S7 verifies are performed at both Vv7 and Vv7-$\Delta_{extra}$, and the next programming pulse is at the accelerated level of $V_{pgm}+\Delta V_{pgm}+\alpha\Delta_{pgm}$, rather than the $V_{pgm}+\Delta V_{pgm}$ value in FIG. 22. Based on the results of the verifies, the latch values are set as shown in FIG. 20.

The fourth line of waveforms in FIG. 23 corresponds to memory cells for which the QDL latch is set to 1 during the verify, so that prior to the S6 state verify this corresponds to memory cells that are to be partially inhibited at Vint. After the S6 state verifies, a QDL=1 value indicates a slow S7 memory cell that is subsequently biased at 0 V for the accelerated S7 programming pulse.

The third line of waveforms in FIG. 23 corresponds to memory cells for which the QDL latch stays 0 during the verify, so that, prior to the S6 state verify, this corresponds to memory cells that are to be programmed enabled at 0V. After the S6 state verifies, a QDL=0 value indicates a fast, but not yet verified S7 memory cell that is subsequently biased at $\Delta_{extra}$ for the accelerated S7 programming pulse.

Figure 24:
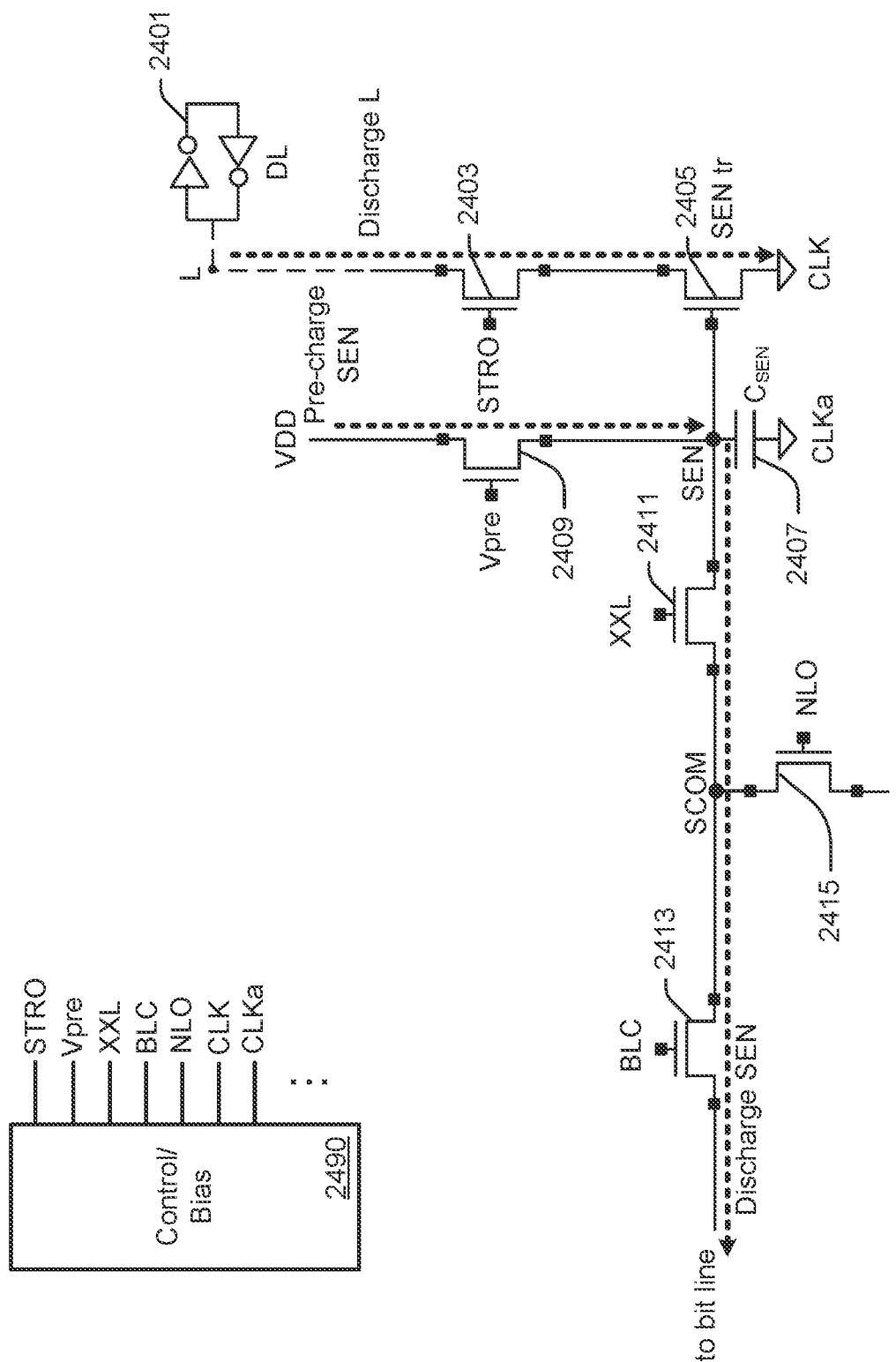
FIG. 24 is a circuit diagram for an embodiment of a sense amplifier structure.
Figure 26:
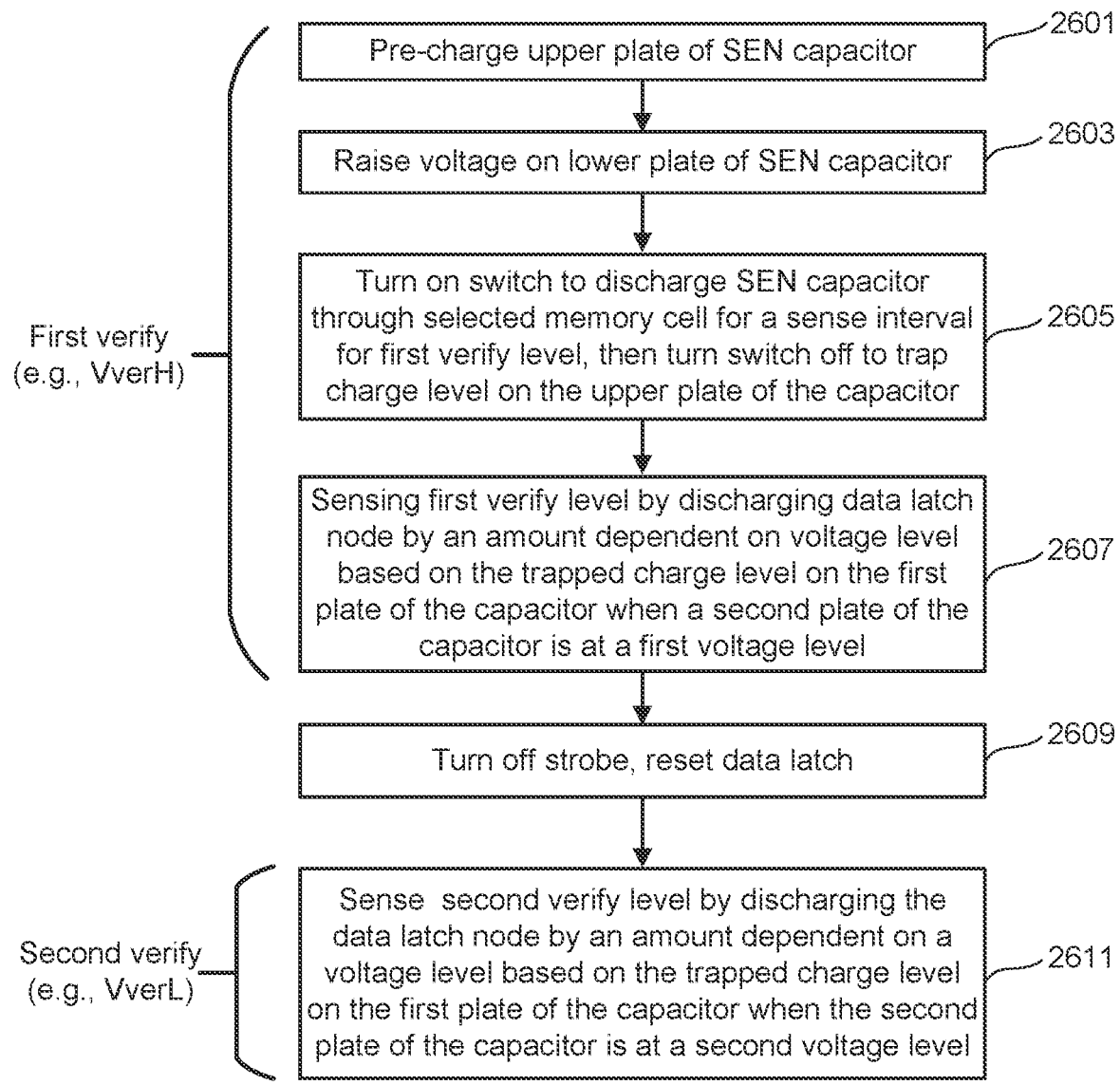
FIG. 26 is a flowchart for one embodiment for a verify operation for multiple voltage thresholds values in which a sensing node is charged and discharged only a single time.

An important factor in programming performance is the speed at which the verify operations can be performed, such as the pair of verify operations at Vv7 and Vv7-$\Delta_{extra}$ performed on the S7 memory cells after the S6 programming finishes. FIGS. 24 and 26 describe a fast sensing technique for verifying at multiple levels.

FIG. 24 is a circuit diagram for an embodiment of a sense amplifier structure, where an actual implementation can include a number of additional elements and FIG. 24 is simplified to elements that enter into the present discussion. In FIG. 24 the result of a sensing operation is set in the latch 2401, where there may be a number of such latches such as the UDL, MDL, LDL, and QDL latches of FIG. 4 that can selectively be connected to latch the value on the node L. The number of such latches typically corresponds to the number of bits stored per cell, plus any latches for additional functions, such as the QDL latch or transfer latches. The value of the latch is determined by the voltage level on the node L, where the node L is pre-charged to the high VDD level and then, depending on the voltage level on the SEN node, either discharged or not through the transistor SEN tr 2405 to the node CLK during a strobe operation when the transistor STRO 2403 is turned on. The voltage level on the SEN node is set by pre-charging SEN to VDD through Vpre 2409, after which it is connected to a selected bit by way of the transistor XXL 2411 and transistor BLC 2413, where any decoding circuitry between BLC 2413 and a selected bit line for the memory array is not shown in the figure. The SCOM node between XXL 2411 and BLC 2413 can be set to a value VLSA, such as ground or pre-charged to a higher level, by way of transistor NLO 2415 when XXL 2411 and BLC 2413 are off. FIG. 24 also schematically represents the control/bias control circuitry 2490 that sets the various levels in FIG. 24, where the same notation (e.g., STRO) is used both for the level and the element to which it is supplied. The Control/Bias circuit 2490 can be implemented in hardware, software, firmware, or combinations of these and the Control/Bias circuit 2490 can be part of one or more of the system control logic 360 of either FIG. 3A or 3B and the sense block of FIG. 4.

To hold charge on the SEN node, a sensing capacitor $C_{sen}$ 2407 is connected to the SEN node, with its lower plate connect to the level CLKa. As illustrated by the broken line arrows, the upper plate of $C_{sen}$ 2407 can be pre-charged by way of the pre-charge transistor Vpre 2409, and then discharged to a selected memory cell along a corresponding bit line by an amount depending on how much current passes through the selected memory cell to set a voltage level on SEN. The level on SEN will then control the amount of current discharged from the node L, and the state latched in DL 2401, by way of the sensing transistor SEN tr 2405.

Figure 25:
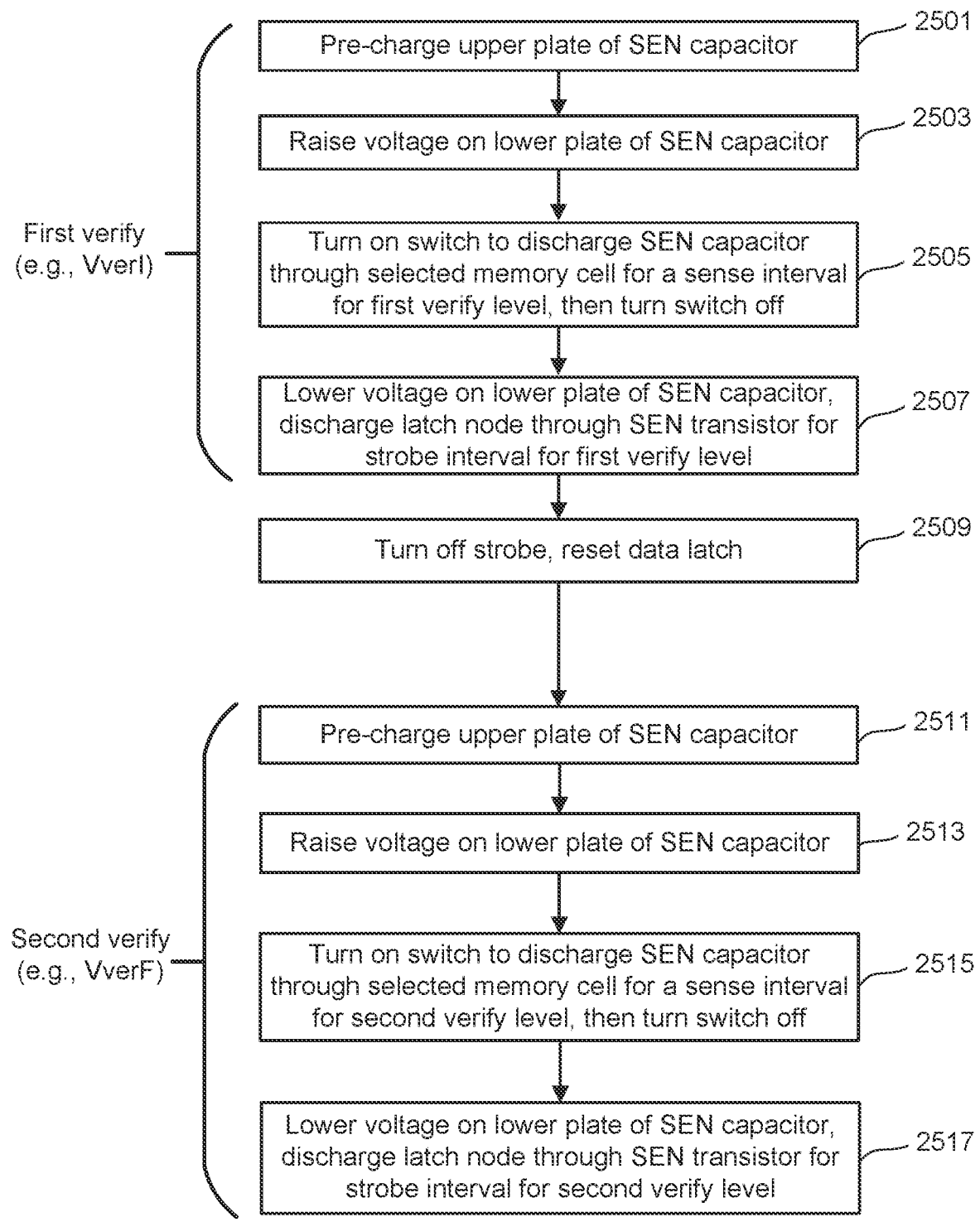
FIG. 25 is a flowchart for one embodiment for a verify operation for multiple voltage thresholds values, where the SEN node is charged and discharged for each of the sensings.

FIG. 25 is a flowchart for one embodiment of a method for a verify operation for multiple voltage thresholds values, where the SEN node is charged and discharged for each of the sensings. The flow of FIG. 25 considers a conventional verify operation for the case of a coarse/fine pair of verifies for the same target data state, but also extends to more verifies performed for multiple different target data states following a programming pulse. In the conventional flow of FIG. 25, the CLK and CLKa values can be the same and, for each sensing, the SEN node (and $C_{sen}$ capacitor 2407) is charge up and discharged through the bit line of the selected memory cell.

At step 2501, the SEN node is pre-charged: with CLKa/CLK set to a low voltage level, such as 0 V, Vpre 2409 is turned on by setting its control signal high, and the upper plate $C_{SEN}$ 2407 is pre-charged to a high level of, in this example, VDD. Next the SEN node is discharged through a selected memory in steps 2503 and 2505. In step 2503, Vpre 2409 is turned off by taking its control signal low and the CLK/CLKa voltage level is raised from its low level of 0 V to a high level of an offset voltage of, for example, 2 V to raise the pre-charge level of the SEN node by the same amount, such as to VDD+2 V for example. The high CLK/CLKa voltage is used to offset voltage drops across XXL 2411, BLC 2413, and other elements along the path from the SEN to the array and memory cell selected for sensing. Once the raised level is established on the SEN node and the selected memory cell is biased for a sensing operation, at step 2505 the XXL 2411 is turned on by setting its control voltage high, as are BLC 241 and any other elements in the current path, so that the $C_{SEN}$ 2407 discharges through the selected memory cell for a sensing interval tsense1, after which XXL 2411 is turned off by taking its control signal low, trapping the remaining charge on the top place of $C_{SEN}$ 2407. The biasing of the selected memory cell includes not only applying a verify voltage (such as described above FIG. 7A-13B) to the control gate, but also biasing other elements along the current path, such as non-selected word lines and select gates when the memory cell is part of a NAND string structure. The resultant level of charge on the top place of $C_{SEN}$ 2407, and consequent voltage level on SEN, will depend on current level thorough the selected memory cells, which in turn depends on voltage applied to the selected memory cell relative to the selected memory cell's threshold voltage and the length of the sensing interval tsense1.

The voltage level on SEN is connected to the control gate of the sensing transistor SEN tr 2405 so that the degree to which the node L will discharge depends the current flow through SEN tr 2405 and the strobe time for which the strobe transistor STRO 2403 is on. The value on the latch node L will determine the state latched in DL 2401. At step 2507, CLK/CLKa is taken low (i.e., 0V) again by lowering by the amount of the offset voltage and the control signal to STRO 2403 is taken high for the strobe time, so that SEN tr 2405 will conduct depending on whether the voltage level on SEN is above or below the threshold voltage of SEN tr 2405. This completes a first sensing operation, such as lower verify level Vverl of a coarse/fine verify and, at step 2509 the switch STRO 2403 is turned off and the data latch DL 2401 can be reset.

Once the data latch has been reset and the bit lines and other circuit element of the array have settled, another verify operation can be performed. For example, if the verify of steps 2501-2509 is for Vverl of a coarse/fine verify, the second verify can be for the VverF level. In other cases, it can be for another data state's verify. This two steps can also be for the fast/median/slow determination for the S7 data state using the Vv7-$\Delta_{extra}$ and Vv7 levels. Steps 2511-2517 largely follow steps 2501-2507, but with either a different voltage on the selected memory cell's control gate, a different sensing interval, or a combination of the two. A typically arrangement for a verify algorithm starts at the lower verify levels and works its way up, as this is more efficient.

At step 2511, the SEN node is again pre-charged with CLKa/CLK set to a low voltage level, such as 0 V, and Vpre 2409 is turned on by setting its control signal high so that the upper plate CSEN 2407 is again pre-charged to a high level of, in this example, VDD. At step 2513, as at step 2503, Vpre 2409 is turned off to isolate the SEN node from the VDD level and the CLK/CLKa level is raised, thereby raising the SEN voltage level to offset the voltage drop between SEN and the selected memory cell.

The SEN node is then discharged through the selected memory cell at step 2515 a second time by setting the control signal for XXL 2411 high, as well as turning on BLC 2413 and other switching circuitry to supply selected memory cell, for an interval tsense2, after which XXL 2411 is turned off by setting its control signal low. To verify at a higher level than for step 2515, the control circuitry 2490 can use tsense2 >tsense1, use a higher control gate voltage for the selected memory cell, or both. As discussed above with respect to step 2505, the other elements in the current path (such as non-selected memory cells of a NAND string) also need to be biased accordingly. Once XXL 2411 is off, the charge level on the upper plate of $C_{SEN}$ 2407 is set. At step 2517, CLK/CLKa is set low and the level on SEN controls SEN tr 2405, with STRO 2403 turned on for the strobing interval so that the node L will either stay at its level or discharge depending on whether the voltage on SEN is above or below the threshold voltage of SEN tr 2405, with the value of DL 2401 set accordingly.

As noted above, the process of FIG. 25 can be extended to more than two verify levels by repeating steps 2509, 2511, 2513, 2517 after step 2517 for each additional level of verify. Each of these sense operations, though, requires that the SEN node be charged up and discharged, with the settling of bit line and other elements outside of the sense amplifier in between. To accelerate the verify process, FIG. 26 presents a verify process where two or more verify levels can be checked with only a single pre-charge SEN node and discharge through the memory array.

FIG. 26 is a flowchart for one embodiment of a verify operation for multiple voltage threshold values in which the SEN node is charged and discharged through the memory array a single time. In the flow of FIG. 26, steps 2601, 2603, 2605, 2607, and 2609 can be implemented largely as described above with respect to the corresponding steps 2501, 2503, 2505, 2507, and 2509 of FIG. 25, but in the flow of FIG. 26 the flow starts at the higher verify level and then continues on to the lower verify level or levels, whereas the flow of FIG. 25 starts at the lower verify level and works its way up.

At step 2601 the SEN node and a first (upper) plate of CSEN 2407 are pre-charged to a high level (e.g., VDD) by turning on Vpre 2409 while XXL 2411 is off and CLKa is low (e.g., 0 V). The control voltages and voltage levels for XXL 2411, Vpre 2409, CLKa, and other signals illustrated in FIG. 24 can be supplied by the Control/Bias circuit 2490, where this can be implemented in hardware, software, firmware, or combinations of these. The one or more control circuits of the Control/Bias circuit 2490 can be part of one or more of the system control logic 360 of either FIG. 3A or 3B and the sense block of FIG. 4. Once the SEN node and plate of $C_{SEN}$ 2407 are pre-charged, at step 2603 Vpre 2409 is turned off by taking its control signal low and CLKa is raised by, for example, 2 V to raise the voltage level of SEN by this amount to offset voltage drops in the path to a selected memory cell. (In the embodiment of FIG. 26, CLKa and CLK can be set independently and, in steps 2601, 2603, and 2605 CLK can be at the same level as CLKa or kept low.)

At step 2605 the switch XXL 2411, along with BLC 2413 and other switches (such as decoders) in the path, is turned on to allow the SEN node and top plate of $C_{SEN}$ 2407 to discharge through a selected memory cell at a rate dependent upon the conduction state of the selected memory cell, which in turns depends on the value of the corresponding word line voltages relative to the memory cells threshold voltage. After a sensing interval, XXL 2411 is turned off, trapping the resultant charge level on the SEN node/top plate of $C_{SEN}$ 2407. The same level of trapped charge (ignoring leakage) at the end of step 2605 due to the single discharge is used for sensing the multiple verify levels of the subsequent steps.

Step 2607 senses a first verify level by setting CLKa and CLK to low (e.g., 0V), so that the control gate voltage on SEN tr 2405 is set by the voltage level the SEN node, which is in turn based on the amount of charge trapped on the upper plate of CSEN 2407 while its lower plate is at 0 V. STRO 2403 is then turned on so that the data latch node L discharges through SEN tr 2405 at a rate dependent on the voltage level on the SEN node. STRO 2403 is then turned off to complete the sensing of the first verify level, where this is higher of the levels being sensed based on the preceding discharge operation. For example, in the set of waveforms of FIG. 23, this would correspond to the Vv7 verify; and in the coarse/fine verify of FIG. 13B, this would correspond to the VverF level. When used for multiple data state, this would be for the highest state. Based on the level on the data latch node L, the result of the sensing is set in the data latch DL 2401.

Once the strobe transistor (STRO 2403) is turned off, the data latch DL 2401 is reset, or alternately, the node L is connected to another data latch, and the data latch node L is reset high at step 2609. At step 2611, a second verify level is sensed based on the same level of charge trapped on the top plate of $C_{SEN}$ 2407. The CLKa level is raised by, for example, 0.5 V, where the amount depends on the difference in threshold voltage levels for the selected memory cell for the different verify levels. CLK stays low (0 V) and STRO 2403 is turned on by setting its control signal high, so that the node L will or will not discharge depending on whether or not the voltage level on the SEN node (boosted by the raised CLKa level of, in the example, 0.5 V) is above or below the threshold voltage of SEN tr 2405. Based on the level on the node L, the result of the second sensing can be latched on the data latch DL 2401. This completes the sensing of the lower verify level, such as the Vv7-$\Delta_{extra}$ level for accelerated S7 verify as illustrated with respect to FIG. 23. For a coarse/fine process as in FIG. 13B, this can correspond to the VverI level.

For multiple data states, this could be any lower voltage threshold states that need to be verified. For more than two verify levels, any additional levels can be similarly verified by repeating steps 2609 and 2611, with an appropriate raising of the CLKa level. The process of FIG. 26 can be much faster than the corresponding process of FIG. 26 as the sensing capacitor $C_{SEN}$ 2407 is only pre-charged and discharged once. The strobing (turning on of STRO 2403) is done twice, or more generally once for each sensed level, but these are CMOS operations within the sense amplifies circuitry without any interaction with the memory array and are consequently much faster operations. In addition to verify operations, a similar approach can be applied to the sensing operations for a data read to reduce read times.

One embodiment includes non-volatile memory device comprising a control circuit configured to connect to an array of non-volatile memory cells. The control circuit is configured to: apply a programming pulse to a selected memory cell of the array; pre-charge a first plate of a sensing capacitor; subsequent to applying the programming pulse and pre-charging the first plate of the sensing capacitor, discharging the first plate of the sensing capacitor through the selected memory cell for a sensing interval and trapping a resultant charge level on the first plate of the sensing capacitor; verify a first threshold voltage level for the selected memory cell by discharging a data latch node by an amount dependent the resultant trapped charge level on the first plate of the sensing capacitor when a second plate of the sensing capacitor is at a first voltage level; and verify a second threshold voltage level for the selected memory cell by discharging the data latch node by an amount dependent the resultant trapped charge level on the first plate of the sensing capacitor when the second plate of the sensing capacitor is at a second voltage level that is higher than the first voltage level.

One embodiment includes a method that includes pre-charging a first plate of a capacitor of a sense amplifier circuit and subsequently turning on a first switch connecting the first plate of the capacitor to a selected memory cell to thereby discharge the first plate of the capacitor at a rate dependent upon a conduction state of the selected memory cell. After discharging the first plate of the capacitor for a sensing interval, the first switch is turned off, thereby trapping a charge level on the first plate of the capacitor. A first threshold voltage level is sensed for the selected memory cell by discharging a data latch node by an amount dependent the trapped charge level on the first plate of the capacitor when a second plate of the capacitor is at a first voltage level; and a second threshold voltage level for the selected memory cell is sensed by discharging the data latch node by an amount dependent the trapped charge level on the first plate of the capacitor when the second plate of the capacitor is at a second voltage level that is higher than the first voltage level.

One embodiment includes a sense amplifier circuit having: a first node; a capacitor having a first plate and a second plate, the first plate connected to the first node; a first switch configured to connect the first node to a selected memory cell; a second switch configured to connect the first node to a high voltage level; a second node; one or more data latches configured to store a data value depended upon a voltage level on the second node; and one or more control circuits connected to the first switch, the second switch and the second plate of the capacitor. The one or more control circuits are configured to: pre-charge the first node by the high voltage level through the second switch; turn on the first switch to discharge the pre-charged first node through the selected memory cell at a rate dependent upon a conduction state of the selected memory cell; after discharging the first node for a sensing interval, turning off the first switch, thereby trapping a charge level on the first plate of the capacitor; determine whether a threshold voltage of the selected memory cell is above a first voltage level by discharging the second node by an amount dependent on a voltage level based on the trapped charge level on the first plate of the capacitor when the second plate of the capacitor is at a first voltage level; and determine whether the threshold voltage of the selected memory cell is above a second voltage level by discharging the second node by an amount dependent on a voltage level based on the trapped charge level on the first plate of the capacitor when the second plate of the capacitor is at a second voltage level.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory device, comprising:
   a control circuit configured to connect to an array of non-volatile memory cells, the control circuit is configured to:
      apply a programming pulse to a selected memory cell of the array;
      pre-charge a first plate of a sensing capacitor;
      subsequent to applying the programming pulse and pre-charging the first plate of the sensing capacitor, discharge the first plate of the sensing capacitor through the selected memory cell for a sensing interval and trap a resultant charge level on the first plate of the sensing capacitor;
      verify a first threshold voltage level for the selected memory cell by discharging a data latch node by an amount dependent the resultant trapped charge level on the first plate of the sensing capacitor when a second plate of the sensing capacitor is at a first voltage level; and
      verify a second threshold voltage level for the selected memory cell by discharging the data latch node by an amount dependent the resultant trapped charge level on the first plate of the sensing capacitor when the second plate of the sensing capacitor is at a second voltage level that is higher than the first voltage level.

2. The non-volatile memory device of claim 1, wherein the control circuit is formed on a control die, the non-volatile memory device further comprising:
   a memory die including the array of non-volatile memory cells, the memory die formed separately from and bonded to the control die.

3. The non-volatile memory device of claim 1, wherein the control circuit is further configured to:
   subsequent to verifying the second threshold voltage level, apply a further programming pulse to the selected memory cell; and
   prior to applying the further programming pulse:

in response to the selected memory cell verifying above the second threshold voltage level, inhibit the selected memory cell from further programming;

in response to the selected memory cell verifying below the second threshold voltage level but above the first threshold voltage level, partially inhibit the selected memory cell from further programming; and in response to the selected memory cell verifying below the first threshold voltage level, programming enable the selected memory cell for further programming.

4. The non-volatile memory device of claim 3, wherein the selected memory cell is configured to store N data states, where N is an integer greater than two; the programming of the (N−1) lowest of the N data states concludes with the programming pulse preceding discharging the first plate of the sensing capacitor, where the programming pulse is one of a series of pulses increasing by a first step size; and the further programming pulse is increased in amplitude relative to the programming pulse preceding discharging the first plate of the sensing capacitor by a second step size, the second step size being greater than the first step size.

5. The non-volatile memory device of claim 1, wherein both of the first threshold voltage level and the second threshold voltage level correspond to a single target data state for the selected memory cell.

6. The non-volatile memory device of claim 1, wherein the control circuit is further configured to:

subsequent to pre-charging the first plate of the sensing capacitor and prior to trapping the resultant charge level on the first plate of the sensing capacitor, raise a voltage level on the second plate of the sensing capacitor by an offset voltage; and subsequent to trapping the resultant charge level on the first plate of the sensing capacitor and prior to verifying the first threshold voltage level, lower the voltage level on the second plate of the sensing capacitor by the offset voltage.

7. The non-volatile memory device of claim 1, wherein to verify the first threshold voltage level for the selected memory cell the control circuit is configured to discharge the data latch node through a transistor having a control gate biased by a voltage level on the first plate of the sensing capacitor when the second plate of the sensing capacitor is at the first voltage level, and wherein to verify the second threshold voltage level for the selected memory cell the control circuit is configured to discharge the data latch node through the transistor having the control gate biased by a voltage level on the first plate of the sensing capacitor when the second plate of the sensing capacitor is at the second voltage level.

8. The non-volatile memory device of claim 1, wherein the control circuit is further configured to:

subsequent to verifying the first threshold voltage level for the selected memory cell and prior to verifying the second threshold voltage level for the selected memory cell, reset a voltage level on the data latch node.

9. A method, comprising:

pre-charging a first plate of a capacitor of a sense amplifier circuit;

subsequently turning on a first switch connecting the first plate of the capacitor to a selected memory cell to thereby discharge the first plate of the capacitor at a rate dependent upon a conduction state of the selected memory cell;

after discharging the first plate of the capacitor for a sensing interval, turning off the first switch, thereby trapping a charge level on the first plate of the capacitor;

sensing a first threshold voltage level for the selected memory cell by discharging a data latch node by an amount dependent the trapped charge level on the first plate of the capacitor when a second plate of the capacitor is at a first voltage level; and sensing a second threshold voltage level for the selected memory cell by discharging the data latch node by an amount dependent the trapped charge level on the first plate of the capacitor when the second plate of the capacitor is at a second voltage level that is higher than the first voltage level.

10. The method of claim 9, further comprising:

prior turning on the first switch, applying a preceding programming pulse the selected memory cell, wherein the first threshold voltage level is a first program verify level and the second threshold voltage level is a second program verify level.

11. The method of claim 10, wherein both of the first verify level and the second verify level correspond to a single target data state for the selected memory cell.

12. The method of claim 11, further comprising:

subsequent to sensing the second threshold voltage level, applying a further programming pulse to the selected memory cell; and prior to applying the further programming pulse:

in response to the selected memory cell verifying above the second program verify level, inhibiting the selected memory cell from further programming;

in response to the selected memory cell verifying below the second program verify level but above the first verify level, partially inhibiting the selected memory cell from further programming; and in response to the selected memory cell verifying below the first verify level, programming enabling the selected memory cell for further programming.

13. The method of claim 12, wherein:

the selected memory cell is configured to store N data states, where N is an integer greater than two, the programming of the (N−1) lowest data states concludes with the preceding programming pulse, where the preceding programming pulse is one of a series of pulses increasing by a first step size, and the further programming pulse is increased in amplitude relative to the preceding programming pulse by a second step size, the second step size being greater than the first step size.

14. The method of claim 9, further comprising:

subsequent to pre-charging the first plate of the capacitor and prior to turning on the first switch, raising a voltage level on the second plate of the capacitor by an offset voltage;

and subsequent to turning off the first switch and prior to sensing the first threshold voltage, lowering the voltage level on the second plate of the capacitor by the offset voltage.

15. The method of claim 9, wherein:

sensing the first threshold voltage level for the selected memory cell includes discharging the data latch node through a transistor having a control gate biased by a voltage level on the first plate of the capacitor when the second plate of the capacitor is at the first voltage level; and sensing the second threshold voltage level for the selected memory cell includes discharging the data latch node through the transistor having the control gate biased by the voltage level on the first plate of the capacitor when the second plate of the capacitor is at the second voltage level.

16. The method of claim 9, further comprising:

subsequent to sensing the first threshold voltage level for the selected memory cell and prior to sensing the second threshold voltage level for the selected memory cell, resetting a voltage level on the data latch node.

17. A sense amplifier circuit, comprising:

a first node;

a capacitor having a first plate and a second plate, the first plate connected to the first node;

a first switch configured to connect the first node to a selected memory cell;

a second switch configured to connect the first node to a high voltage level;

a second node;

one or more data latches configured to store a data value depended upon a voltage level on the second node; and one or more control circuits connected to the first switch, the second switch and the second plate of the capacitor, the one or more control circuits configured to:

pre-charge the first node by the high voltage level through the second switch;

turn on the first switch to discharge the pre-charged first node through the selected memory cell at a rate dependent upon a conduction state of the selected memory cell;

after discharging the first node for a sensing interval, turning off the first switch, thereby trapping a charge level on the first plate of the capacitor;

determine whether a threshold voltage of the selected memory cell is above a first voltage level by discharging the second node by an amount dependent on a voltage level based on the trapped charge level on the first plate of the capacitor when the second plate of the capacitor is at a first voltage level; and determine whether the threshold voltage of the selected memory cell is above a second voltage level by discharging the second node by an amount dependent on a voltage level based on the trapped charge level on the first plate of the capacitor when the second plate of the capacitor is at a second voltage level.

18. The sense amplifier circuit of claim 17, wherein the one or more control circuits are further configured to:

subsequent to pre-charging the first node and prior to turning on the first switch, raise a voltage level on the second plate of the capacitor by an offset voltage; and subsequent to turning off the first switch and prior to determining whether a threshold voltage of the selected memory cell is above a first voltage level, lower the voltage level on the second plate of the capacitor by the offset voltage.

19. The sense amplifier circuit of claim 17, further comprising:

a sensing transistor connectable to the second node and having a control gate connected to the first node, wherein, when, to determine whether the threshold voltage of the selected memory cell is above the first voltage level and to determine whether the threshold voltage of the selected memory cell is above the second voltage level, the second node is discharged through the sensing transistor.

20. The sense amplifier circuit of claim 17, wherein the one or more control circuits are further configured to:

subsequent to determining whether the threshold voltage of the selected memory cell is above a first voltage level and prior to determining whether the threshold voltage of the selected memory cell is above the second voltage level, resetting a voltage level on the second node.

\* \* \* \* \*